United States Patent
Hiiro

(10) Patent No.: US 12,027,820 B2
(45) Date of Patent: Jul. 2, 2024

(54) SURFACE-EMITTING LASER AND METHOD OF MANUFACTURING THE SAME

(71) Applicant: SUMITOMO ELECTRIC INDUSTRIES, LTD., Osaka (JP)

(72) Inventor: Hiroyuki Hiiro, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 738 days.

(21) Appl. No.: 17/210,591

(22) Filed: Mar. 24, 2021

(65) Prior Publication Data

US 2021/0320476 A1 Oct. 14, 2021

(30) Foreign Application Priority Data

Apr. 8, 2020 (JP) ................................. 2020-069846

(51) Int. Cl.
*H01S 5/183* (2006.01)
*H01S 5/343* (2006.01)

(52) U.S. Cl.
CPC ...... *H01S 5/18361* (2013.01); *H01S 5/18305* (2013.01); *H01S 5/18313* (2013.01); *H01S 5/18347* (2013.01); *H01S 5/1835* (2013.01); *H01S 5/34313* (2013.01)

(58) Field of Classification Search
CPC ............. H01S 5/18361; H01S 5/18305; H01S 5/18313; H01S 5/1835; H01S 5/18386
See application file for complete search history.

(56) References Cited

U.S. PATENT DOCUMENTS

| | | | |
|---|---|---|---|
| 2002/0110169 A1* | 8/2002 | Iwai ................... | H01S 5/18352 372/50.11 |
| 2006/0056476 A1 | 3/2006 | Hiiro et al. | |
| 2014/0247849 A1* | 9/2014 | Kasuya .............. | H01S 5/34313 372/45.01 |
| 2016/0248226 A1* | 8/2016 | Kaneko .................. | G04F 5/145 |
| 2020/0169061 A1 | 5/2020 | Mitomo et al. | |

FOREIGN PATENT DOCUMENTS

| | | |
|---|---|---|
| JP | H6-169129 A | 6/1994 |
| JP | H10-79555 A | 3/1998 |
| JP | 2012-511824 A | 5/2012 |
| WO | 2010/067261 A1 | 6/2010 |
| WO | 2019/017044 A1 | 1/2019 |

OTHER PUBLICATIONS

Govind P. Agrawal, "Generalized rate equations and modulation characteristics of external cavity semi conductor lasers", Journal of Applied Physics, vol. 56, No. 11, pp. 3110-3115, 1984.

Wissam Hamad et a l., "Small-Signal Analysis of Ultra-High-Speed Multi-Mode VCSELs", IEEE Journal of Quantum Electronics, vol. 52, No. 7, pp. 1-12, Jun. 2016.

\* cited by examiner

*Primary Examiner* — Yuanda Zhang
(74) *Attorney, Agent, or Firm* — Oliff PLC

(57) ABSTRACT

A surface-emitting laser includes a first reflector layer, an active layer provided on the first reflector layer, and a second reflector layer provided on the active layer. The second reflector layer includes a corner reflector that tapers in a direction opposite to the first reflector layer, and the corner reflector has a plan shape of a circle or a polygon with an even number of vertexes.

18 Claims, 13 Drawing Sheets

SURFACE-EMITTING LASER AND METHOD OF MANUFACTURING THE SAME

CROSS-REFERENCE TO RELATED APPLICATION

This application claims priority based on Japanese Patent Application No. 2020-069846 filed on Apr. 8, 2020, and the entire contents of the Japanese patent application are incorporated herein by reference.

FIELD OF THE INVENTION

The present disclosure relates to a surface-emitting laser and a method of manufacturing the same.

BACKGROUND ART

A surface-emitting-type laser diode (surface-emitting laser) is known. The surface-emitting laser has a reflector layer and an active layer provided on a substrate. There is a technique in which a corner reflector is provided on an active layer to form a resonator using the corner reflector and the reflector layer (see Patent Document 1: U.S. Patent Application Publication No. 2006/0056476).

SUMMARY OF THE INVENTION

A surface-emitting laser according to the present disclosure includes a first reflector layer; an active layer provided on the first reflector layer; and a second reflector layer provided on the active layer. The second reflector layer includes a corner reflector that tapers in a direction opposite to the first reflector layer, and the corner reflector has a plan shape of a circle or a polygon with an even number of vertexes.

A method of manufacturing a surface-emitting laser according to the present disclosure includes the steps of stacking a first reflector layer, an active layer, and a second reflector layer in this order on a substrate; and forming, in the second reflector layer, a corner reflector that tapers in a direction opposite to the first reflector layer by etching a portion of the second reflector layer. The corner reflector has a plan shape of a circle or a polygon with an even number of vertexes.

DESCRIPTION OF EMBODIMENTS

Figure 1A:
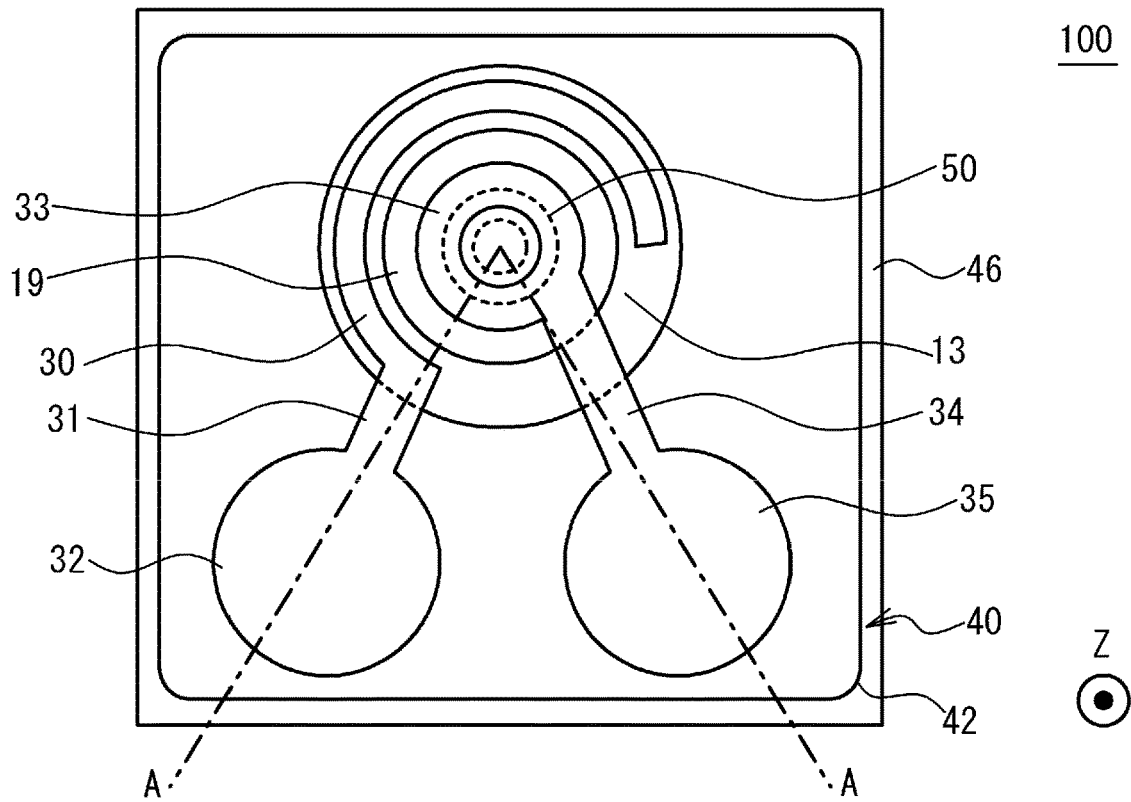
FIG. 1A is a plan view illustrating a surface-emitting laser according to a first embodiment.

In order to expand a modulation characteristic of a surface-emitting laser, it is effective to reduce the number of peaks in oscillation spectrum. Accordingly, it is an object of the present disclosure to provide a surface-emitting laser capable of reducing the number of peaks in oscillation spectrum and a method of manufacturing the same.

DESCRIPTION OF EMBODIMENTS OF THE INVENTION

First, the contents of embodiments according to the present disclosure will be listed and described.

(1) An embodiment of the present disclosure is a surface-emitting laser includes a first reflector layer; an active layer provided on the first reflector layer; and a second reflector layer provided on the active layer. The second reflector layer includes a corner reflector that tapers in a direction opposite to the first reflector layer, and the corner reflector has a plan shape of a circle or a polygon with an even number of vertexes. The corner reflector inverts the amplitude distribution of a light and reflects the light. Rotationally asymmetrical high-order transverse modes are suppressed and only rotationally symmetrical high-order transverse modes oscillate. Consequently, the number of peaks in the oscillation spectrum can be reduced.

(2) When the corner reflector is rotated by a predetermined angle of 360/8 degrees or less around an optical axis of the surface-emitting laser, the corner reflector may have a rotational symmetry that overlaps the corner reflector before the rotation. Since the corner reflector has many rotational symmetries about the optical axis, the rotationally asymmetrical high-order transverse modes are suppressed and only the rotationally symmetrical high-order transverse modes oscillate. Consequently, the number of peaks in the oscillation spectrum can be reduced.

(3) The corner reflector may have a shape of a truncated cone or a truncated polygonal pyramid, and a top surface of the corner reflector may be an emitting window configured to emit a light. Since the corner reflector has many rotational symmetries about the optical axis, the rotationally asymmetrical high-order transverse modes are suppressed and only the rotationally symmetrical high-order transverse modes oscillate. Consequently, the number of peaks in the oscillation spectrum can be reduced. It is possible to emit a light from the top surface of the corner reflector.

(4) The surface-emitting laser may further include a cap layer provided on a side surface of the corner reflector. The cap layer may have a refractive index of 2.73 or more and lower than the second reflector layer, and the light may be emitted from the top surface of the corner reflector and a top surface of the cap layer. The cap layer can guide a light to the emitting window to emit the light from the emitting window. The loss of light can be suppressed.

(5) The second reflector layer may include an oxidized region extending inwardly from a side surface of the corner reflector. The oxidized region functions as a diffraction grating, and light is scattered by the diffraction grating and emitted from the emitting window.

(6) The surface-emitting laser may further include a substrate. The first reflector layer, the active layer, and the second reflector may be provided in this order on the substrate. The corner reflector may have a shape of a cone or a polygonal pyramid, and a lower surface of the substrate may be an emitting window configured to emit a light. Since the corner reflector has many rotational symmetries about the optical axis, the rotationally asymmetrical high-order transverse modes are suppressed and only the rotationally symmetrical high-order transverse modes oscillate. The number of peaks in the oscillation spectrum can be reduced. The light can be emitted from the substrate.

(7) The width of the emitting window may be twice or more of a width capable of emitting the light of only basic traverse-mode components. By emitting lights of high-order transverse mode components together with basic traverse-mode components, the light output can be increased.

(8) The corner reflector may be configured to reflect a light with inverting an amplitude distribution of an incident light. The rotationally asymmetrical high-order transverse modes are suppressed and only the rotationally symmetrical high-order transverse modes oscillate. The number of peaks in the oscillation spectrum can be reduced. The light can be emitted from the substrate.

(9) The side surface of the corner reflector may include a surface that is inclined by 45° with respect to a top surface of the first reflector layer. A light incident on the corner is reflected with inverting the amplitude distribution of the light and returns to the first reflector layer.

(10) Each of the first reflector layer and the second reflector layer may be a distributed Bragg reflector (DBR) layer including a plurality of stacked semiconductor layers.

(11) The first reflector layer may be a p-type or n-type semiconductor layer. The second reflector layer may include a third reflector layer and a fourth reflector layer that are stacked in order above the active layer. The third reflector layer may be a semiconductor layer of a conductivity type opposed to a conductivity type of the first reflector layer, and the fourth reflector layer may be an undoped semiconductor layer. The parasitic capacitance is reduced by providing the second reflector layer with a tapered corner reflector and by having the undoped fourth reflector layer in the second reflector layer. It is possible to obtain a high-speed modulation characteristic by lowering the parasitic capacitance.

(12) A method of manufacturing a surface-emitting laser includes the steps of stacking a first reflector layer, an active layer, and a second reflector layer in this order on a substrate; and forming, in the second reflector layer, a corner reflector that tapers in a direction opposite to the first reflector layer by etching a portion of the second reflector layer. In this method, the corner reflector has a plan shape of a circle or a polygon with an even number of vertexes. Rotationally asymmetrical high-order transverse modes are suppressed and only rotationally symmetrical high-order transverse modes oscillate. Consequently, the number of peaks in the oscillation spectrum can be reduced. By reducing the number of peaks in the oscillation spectrum, the modulation bandwidth can be enlarged and a high-speed modulation characteristic can be obtained. Because a portion of the second reflector layer is etched, the volume of the second reflector layer is reduced and thus the parasitic capacitance is reduced.

Details of Embodiments of the Disclosure

Specific examples of a surface-emitting laser and a method of manufacturing a surface-emitting laser according to an embodiment of the present disclosure will be described below with reference to the drawings. It should be understood that the present disclosure is not limited to the examples disclosed herein. The scope of the present disclosure is defined by the claims, and is intended to include all the modifications within the scope and meaning equivalent to the scope of the claims. In the description, like or corresponding elements are denoted by like reference numerals and redundant descriptions thereof will be omitted.

First Embodiment (Surface-Emitting Laser)

Figure 1B:
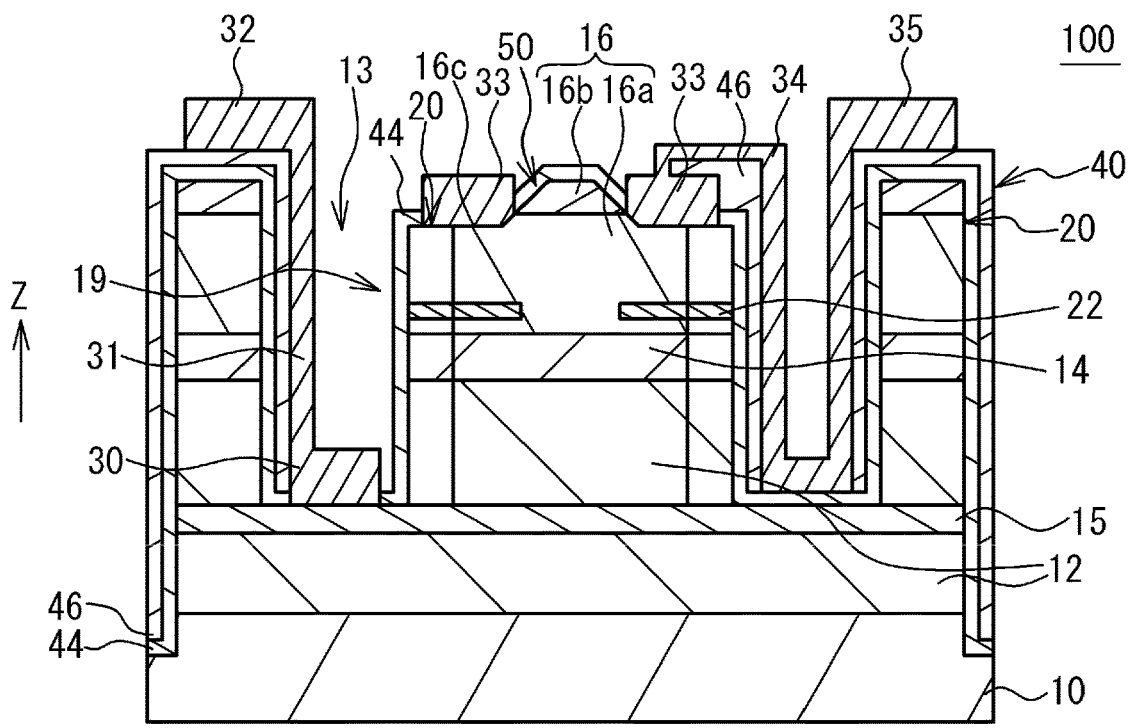
FIG. 1B is a cross-sectional view illustrating the surface-emitting laser taken along line A-A in FIG. 1A.

FIG. 1A is a plan view illustrating a surface-emitting laser 100 according to a first embodiment. FIG. 1B is a cross-sectional view illustrating the surface-emitting laser 100 taken along line A-A in FIG. 1A.

As illustrated in FIG. 1A, the surface-emitting laser 100 is, for example, a vertical-cavity surface-emitting laser having a rectangular shape with a side length of 200 μm to 300 μm.

As illustrated in FIG. 1A, the surface-emitting laser 100 is provided with a mesa 40. The mesa 40 has a rectangular plan shape, and each vertex has a chamfered portion 42. A groove 13 and a mesa 19 are provided in a region surrounded by the mesa 40.

Pads 32 and 35 are provided on the mesa 40.

The plan shape of the mesa 19 is circular, as illustrated in FIG. 1A. The mesa 19 is surrounded by the groove 13 and functions as a light-emitting portion of the surface-emitting laser 100. An electrode 33 is provided on the mesa 19. The electrode 33 is electrically connected to the pad 35 by a wiring 34. An electrode 30 is provided on the groove 13. The electrode 30 is electrically connected to the pad 32 by a wiring 31. The pads 32 and 35 are used to electrically connect the surface-emitting laser 100 to an external device.

As illustrated in FIG. 1B, the surface-emitting laser 100 includes a substrate 10, a lower distributed Bragg reflector (DBR) layer 12 (first reflector layer) and an active layer 14, an upper DBR layer 16 (second reflector layer). The lower DBR layer 12, the active layer 14, the upper DBR layer 16 are sequentially stacked on the substrate 10. A contact layer 15 is provided in the middle of the lower DBR layer 12. The upper DBR layer 16 has a p-DBR layer 16a and an i-DBR layer 16b stacked in order on the active layer 14. A corner reflector 50 is provided in the upper DBR layer 16. The stacking direction of the layers illustrated in FIG. 1B is defined as a Z-axis direction. A direction along the Z-axis from the corner reflector 50 toward the substrate 10 is defined as a downward direction, and a direction along the Z-axis from the substrate 10 toward the corner reflector 50 is defined as an upward direction.

The substrate 10, the lower DBR layer 12, the contact layer 15, the active layer 14 and the upper DBR layer 16 form the mesa 40. The lower DBR layer 12, the contact layer 15, the active layer 14 and the upper DBR layer 16 form the mesa 19. The mesas 19 and 40 extend in the upward direction and are, for example, perpendicular to the top surface of the substrate 10. The corner reflector 50 is provided in the center of the mesa 19. A side surface of the corner reflector 50 is inclined, for example, by 45° with respect to a surface 16c of the p-DBR layer 16a.

The substrate 10 is a semiconductor substrate formed of, for example, semi-insulating gallium arsenide (GaAs). The lower DBR layer 12 is, for example, a semiconductor multilayer in which n-type aluminum gallium arsenide layers ($Al_xGa_{1-x}As$ with $0 \le x \le 0.3$ and $Al_yGa_{1-y}As$ with $0.7 \le y \le 1$) each having a different composition are alternately stacked each with an optical film thickness of $\lambda/4$. The $\lambda$ is a wavelength of the light emitted by the active layer 14. The lower DBR layer 12 is doped with silicon (Si), for example. The contact layer 15 is formed of n-type AlGaAs or GaAs, for example.

The active layer 14 is formed of AlGaAs and indium gallium arsenide (InGaAs), for example. The active layer 14 has a multiple quantum well (MQW) structure in which quantum well layers and barrier layers are alternately stacked, and has an optical gain. Separate confinement heterostructure (SCH) layers (not illustrated) are interposed between the active layer 14 and the lower DBR layer 12 and between the active layer 14 and the upper DBR layer 16.

The upper DBR layer 16 is, for example, a semiconductor multilayer in which $Al_xGa_{1-x}As$ ($0 \le x \le 0.3$) and $Al_yGa_{1-y}As$ ($0.7 \le y \le 1$) are alternately stacked each with an optical film thickness of $\lambda/4$. The p-DBR layer 16a is, for example, a p-type semiconductor layer doped with carbon (C). The i-DBR layer 16b is an undoped semiconductor layer. A portion of the corner reflector 50 which is connected to the electrode 33 and serves as a current path is formed of the p-DBR layer 16a. Another portion of the corner reflector 50 that is not connected to the electrode 33 and is not a current path is formed of the i-DBR layer 16b.

The substrate 10, the lower DBR layer 12, the contact layer 15, the active layer 14, the upper DBR layer 16 may be formed of compound semiconductors other than those described above. For example, the substrate 10 may be formed of a compound semiconductor other than GaAs, such as $Al_xGa_{1-x}As$ ($0 \le x \le 0.2$).

An oxide confinement layer 22 is formed by selectively oxidizing a portion of the upper DBR layer 16. As illustrated in FIG. 1B, the oxide confinement layer 22 extends inwardly from an end portion of the upper DBR layer 16 of the mesa 19 and is not formed in the center of the upper DBR layer 16. The oxide confinement layer 22 includes aluminum oxide ($Al_2O_3$), for example, and is insulating, so that the oxide confinement layer 22 is less conductive than an unoxidized portion. Therefore, the unoxidized portion in the center of the upper DBR layer 16 serves as a current path, enabling an efficient current injection.

A high-resistance region 20 is formed on the periphery of the mesa 19 and on the mesa 40. For example, ions such as protons are implanted in a portion above the contact layer 15 in the lower DBR layer 12, and in the active layer 14 and the upper DBR layer 16 to form the high-resistance region 20. The groove 13 penetrates through the high-resistance region 20 in the thickness direction and surrounds the mesa 19. The contact layer 15 forms a bottom surface of the groove 13.

An insulating film 44 is formed of silicon oxynitride (SiON) or silicon oxide ($SiO_2$) having a thickness of 400 nm, for example, and covers the surfaces of the mesas 19 and 40. An insulating film 46 is formed of an insulator such as a 100 nm-thick SiN film and covers the insulating film 44.

The electrode 30 is, for example, an n-type electrode having a stacked structure of gold (Au), germanium (Ge), and nickel (Ni). The electrode 30 is provided on the upper surface of the contact layer 15 in the groove 13. The electrode 30 is an ohmic electrode electrically connected to the contact layer 15. The electrode 33 is, for example, a p-type electrode having a stacked structure of titanium (Ti), platinum (Pt), and gold (Au). The electrode 33 is provided on an upper surface and an inclined surface of the p-DBR layer 16a on the mesa 19. The electrode 33 is an ohmic electrode electrically connected to the p-DBR layer 16a.

The pads 32 and 35 are disposed on the mesa 40 outside the mesa 19. The wiring 31 electrically connects the pad 32 and the electrode 30. The wiring 34 electrically connects the pad 35 and the electrode 33. The wirings 31 and 34, and the pads 32 and 35 are formed of a metal such as Au. Seed metals (not illustrated) may be provided under the wirings and the pads.

Figure 2:
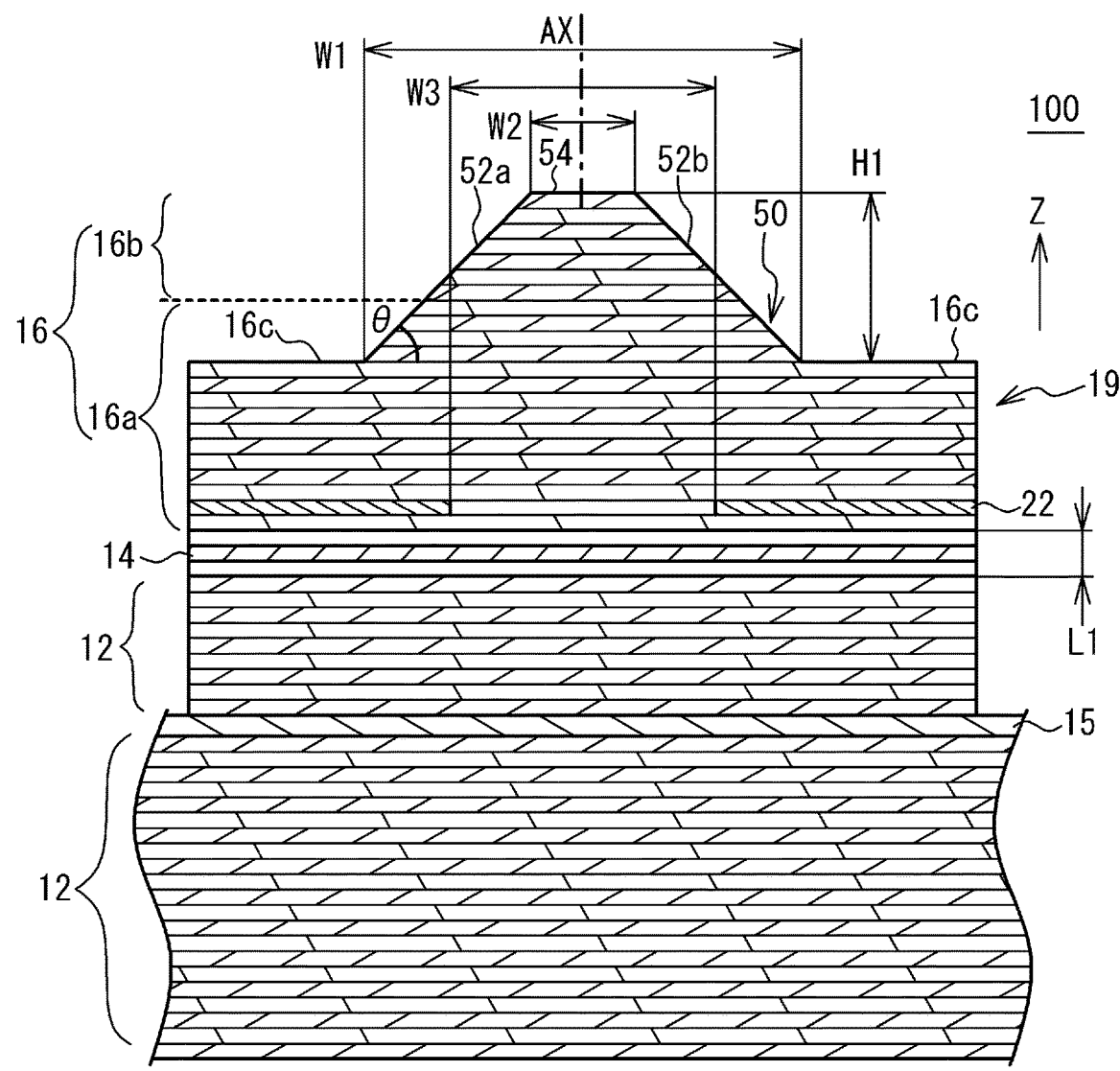
FIG. 2 is an enlarged cross-sectional view of a mesa.
Figure 3A:
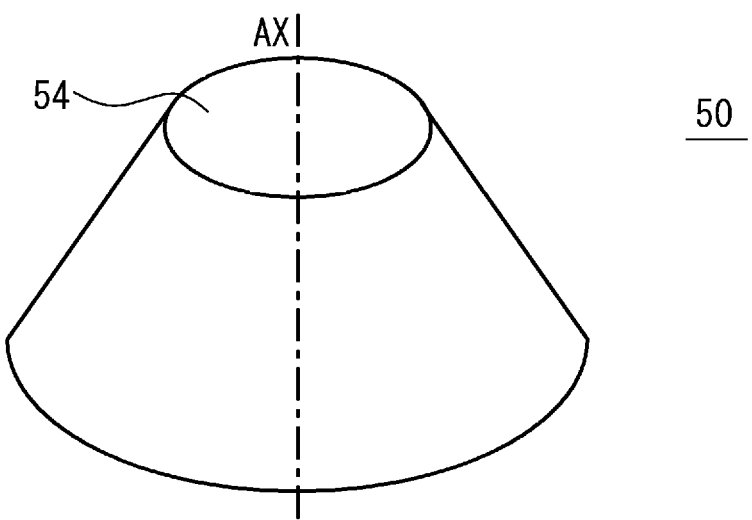
FIG. 3A is a perspective view illustrating a corner reflector.
Figure 3B:
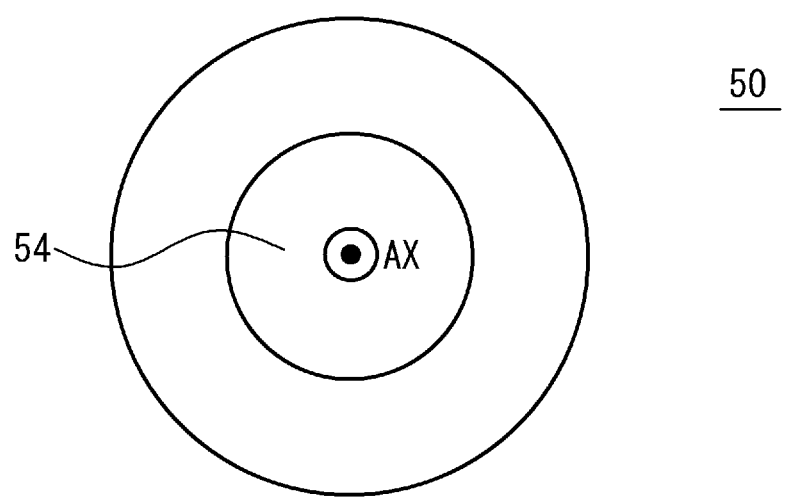
FIG. 3B is a plan view illustrating the corner reflector.

FIG. 2 is an enlarged cross-sectional view of the mesa 19. FIG. 3A is a perspective view illustrating the corner reflector 50. FIG. 3B is a plan view illustrating the corner reflector 50. In FIGS. 3A and 3B, the configuration other than the corner reflector 50 is not illustrated. An optical axis AX of the surface-emitting laser 100 extends in the Z-axis direction.

As illustrated in FIG. 2, the lower DBR layer 12 and the upper DBR layer 16 are semiconductor multilayers. The corner reflector 50 is provided in the upper DBR layer 16. The corner reflector 50 tapers upward from the surface 16c of the upper DBR layer 16. As illustrated in FIG. 3A, the corner reflector 50 is an axicon retro-reflector having a truncated cone shape. As illustrated in FIG. 3B, the plan shape of the corner reflector 50 (the shape seen from the Z-axis direction) is a circle. The corner reflector 50 has a rotational symmetry about the optical axis AX.

The sides of the corner reflector 50 in FIG. 2 are referred to as surfaces 52a and 52b, respectively. The surfaces 52a and 52b are inclined, for example, by 45° with respect to the top surfaces of the substrate 10, the lower DBR layer 12, and the active layer 14, and the surface 16c of the upper DBR layer 16. A surface 54 is the top surface of the corner reflector 50 and is parallel to the top surface of the substrate 10. The surface 54 functions as a light emitting window. A height H1 from the surface 16c to the surface 54 is 2.5 µm or less, for example. A width W1 of a lower portion of the corner reflector 50 is 10 for example, and a width W2 of an upper portion thereof is 5 for example. A width W3 between inner ends of the oxide confinement layer 22 are 7 for example.

The lower DBR layer 12 and the upper DBR layer 16 form a resonator (first resonator). The corner reflector 50 and the lower DBR layer 12 form a resonator (second resonator). The first resonator and the second resonator form a composite resonator, and the second resonator can be considered as an external resonator.

By applying a voltage to the pads 32 and 35 illustrated in FIGS. 1A and 1B to inject carriers into the active layer 14, the active layer 14 emits a light. The light emitted from the active layer 14 repeatedly reflects between the lower DBR layer 12 and the upper DBR layer 16 to resonate.

The corner reflector 50 reflects a light with inverting the amplitude distribution of the light with respect to the optical axis. For example, a light incident on the surface 52a of the corner reflector 50 from the downward direction is totally reflected on the surface 52a, enters the opposite surface 52b across the optical axis AX, is totally reflected on the surface 52b, and returns to the incident direction (downward direction). The light is reflected by the lower DBR layer 12 and re-enters the corner reflector 50. A light entering the surface 52b from the downward direction is totally reflected on the surface 52b, enters the surface 52a, is totally reflected on the surface 52a, and returns to the downward direction. The light repeatedly reflects between the corner reflector 50 and the lower DBR layer 12 to oscillate, and is emitted from the surface 54.

When the surface-emitting laser is used for optical communication or the like, the modulation characteristic of the surface-emitting laser is critical. A modulation bandwidth needs to be a high bandwidth for a high-speed modulation. According to the first embodiment, the modulation bandwidth of the surface-emitting laser 100 can be the high bandwidth. The modulation characteristic is affected by a resonator length, the number of peaks in an oscillation spectrum and the parasitic capacitance.

The effect of the resonator length will be described below. The modulation bandwidth of the surface-emitting laser is determined by a relaxation oscillation frequency, and the higher the relaxation oscillation frequency, the higher the modulation bandwidth. As indicated by the following equation, the relaxation oscillation frequency $\omega_R$ is proportional to the reciprocal of the square root of a photon lifetime $\tau_p$.

$$\omega_R \propto \frac{1}{\sqrt{\tau_p}} \quad \text{[Equation 1]}$$

As indicated by the following equation, the photon lifetime $\tau_p$ is proportional to an effective resonator length $L_{eff}$.

$$\tau_p \propto L_{eff} \quad \text{[Equation 2]}$$

The shorter the resonator length, the higher the relaxation oscillation frequency $\omega_R$, and the modulation bandwidth can be higher.

According to "Generalized rate equations and modulation characteristics of external-cavity semiconductor lasers" (Agrawal, Journal of Applied Physics 56, 3110, 1984), the relaxation oscillation frequency of the resonator is further increased by providing an external resonator.

Since the width W1 of the corner reflector 50 is 10 μm, for example, the resonator length of the second resonator (external resonator) formed by the lower DBR layer 12 and the corner reflector 50 is also about 10 μm. On the other hand, a resonator length L1 of the first resonator formed by the lower DBR layer 12 and the upper DBR layer 16 is smaller than the resonator length of the second resonator, and is about λ/2 for example. When the oscillation wavelength λ is 850 nm, for example, the resonator length L1 is about λ/2, that is, about 425 nm. Therefore, the effective resonator length $L_{eff}$ is shortened, the photon lifetime $\tau_p$ is lowered, and thus the relaxation oscillation frequency $\omega_R$ is increased. As a result, even in the surface-emitting laser having the corner reflector, the modulation characteristic equal to or higher than that of the surface-emitting laser having only a resonator formed by the lower DBR layer and the upper DBR layer can be obtained.

In Patent Document 1, an upper DBR layer is not formed, and a lower DBR layer and a corner reflector form a resonator. The resonator length is long, and about 10 μm. On the other hand, in the first embodiment, the resonator length L1 of the first resonator is about λ/2 (i.e., 425 nm), which is about 1/20 times of 10 μm. Therefore, the photon lifetime $\tau_p$ is approximately 1/20 times, and the relaxation oscillation frequency $\omega_R$ is approximately √20 times (i.e., 4.5 times).

Figure 4A:
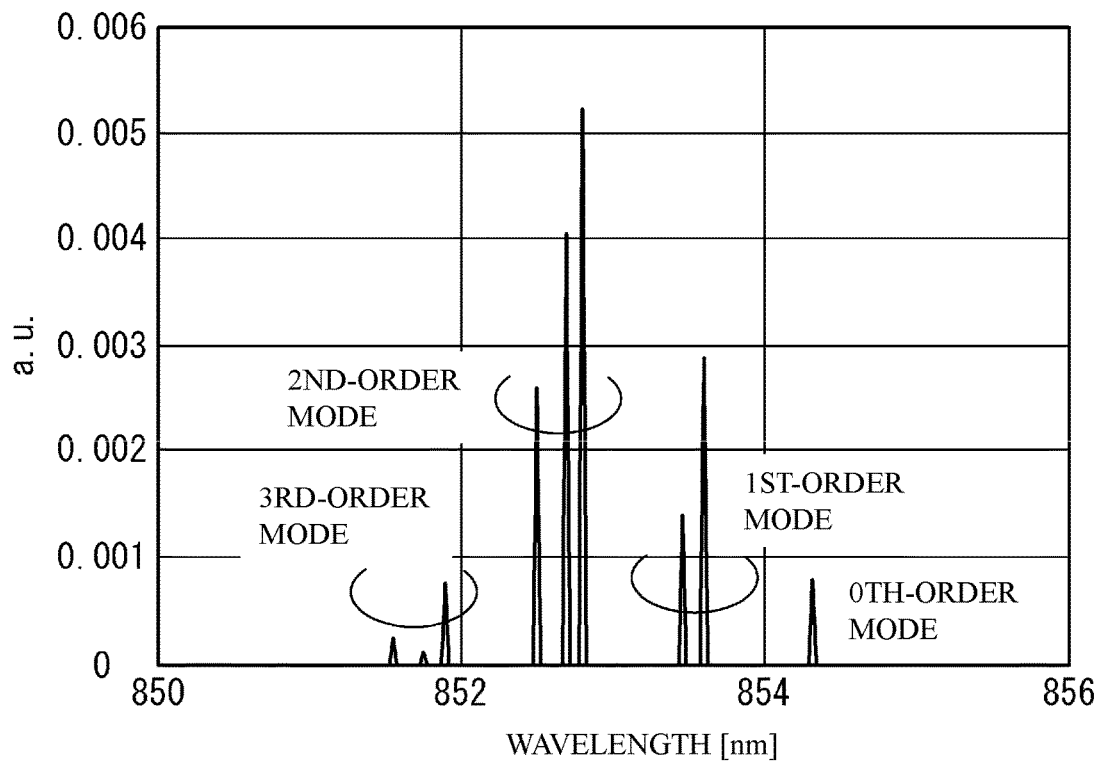
FIG. 4A is a diagram illustrating an oscillation spectrum in Comparative Example.

Next, the effect of the number of peaks in an oscillation spectrum on the modulation characteristic will be described. FIG. 4A is a diagram exemplifying an oscillation spectrum in a comparative example, and is the oscillation spectrum when a bias current of 12 mA is inputted to a surface-emitting laser. In the comparative example, no corner reflector is provided in the upper DBR layer 16, and the other configurations are the same as the surface-emitting laser in the first embodiment. As illustrated in FIG. 4A, a zeroth-order mode (basic mode) and first-order to third-order transverse modes oscillate. Each of the first-order to third-order transverse modes contains a plurality of peaks. This is because rotationally symmetrical high-order transverse modes and rotationally asymmetrical high-order transverse modes oscillate.

Figure 4B:
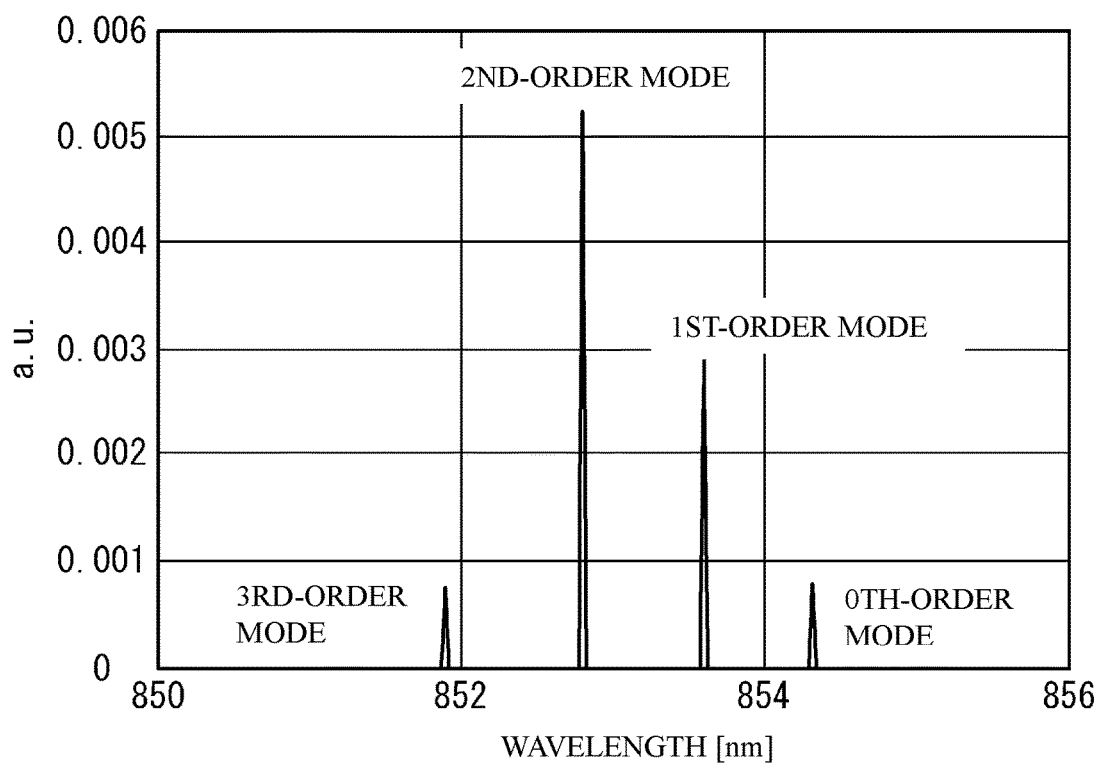
FIG. 4B is a diagram illustrating an oscillation spectrum in the first embodiment.

FIG. 4B is a diagram illustrating the oscillation spectrum in the first embodiment. The number of peaks in the first-order to third-order modes is reduced compared with the number of peaks in FIG. 4A. Each mode has a single peak. The number of peaks in the oscillation spectrum in FIG. 4B is approximately half of that in FIG. 4A.

The corner reflector 50 and the lower DBR layer 12 form the second resonator. As illustrated in FIGS. 3A and 3B, the corner reflector 50 has a rotational symmetry about the optical axis AX, and reflect a light with inverting the amplitude distribution of the light. Rotationally asymmetrical high-order transverse modes are suppressed by the second resonator, and only rotationally symmetrical high-order transverse modes oscillate. As a result, the number of peaks in the oscillation spectrum is reduced as illustrated in FIG. 4B.

The modulation characteristic during multimode oscillation is determined by the relaxation oscillation frequency during the multimode oscillation. According to "Small-Signal Analysis of Ultra-High-Speed Multi-Mode VCSELs" (Wissam Hamad et al. IEEE JOURNAL OF QUANTUM ELECTRONICS, VOL. 52, NO. 7, June 2016), the relaxation oscillation frequency $\omega_R$ is expressed by the following equation using a threshold gain $g_{th}$, a confinement coefficient Γ, a differential gain $a_i$ of each mode, and a photon density $S_i$ of each mode.

$$\omega_R^2 = v_s^2 g_{th} \Gamma \sum_i a_i S_i \quad \text{[Equation 3]}$$

As the number of peaks in the oscillation spectrum decreases, the differential gain $a_i$ in each mode increases. In FIG. 4B, the differential gain $a_i$ is about twice as large as that in FIG. 4A because the number of peaks in the oscillation spectrum is about half as large as that in FIG. 4A. The relaxation oscillation frequency increases about √2 times (i.e., 1.4 times). As a result, a high-speed modulation characteristic is obtained.

The parasitic capacitance also affects the modulation characteristic. In the surface-emitting laser 100, the corner reflector 50 is formed by etching the p-DBR layer 16a. As the volume of the p-DBR layer 16a decreases, the parasitic capacitance decreases, and the modulation bandwidth expands. The volume of the p-DBR layer 16*a* is reduced to about half of that when no corner reflector 50 is provided. This effect increases the modulation bandwidth by a factor of about 1.4. When the effect of the reduction in the number of peaks in the spectrum and the effect of the reduction in the parasitic capacitance are combined, the modulation bandwidth is approximately doubled compared to when no corner reflector 50 is provided.

(Manufacturing Method)

Figure 5A:
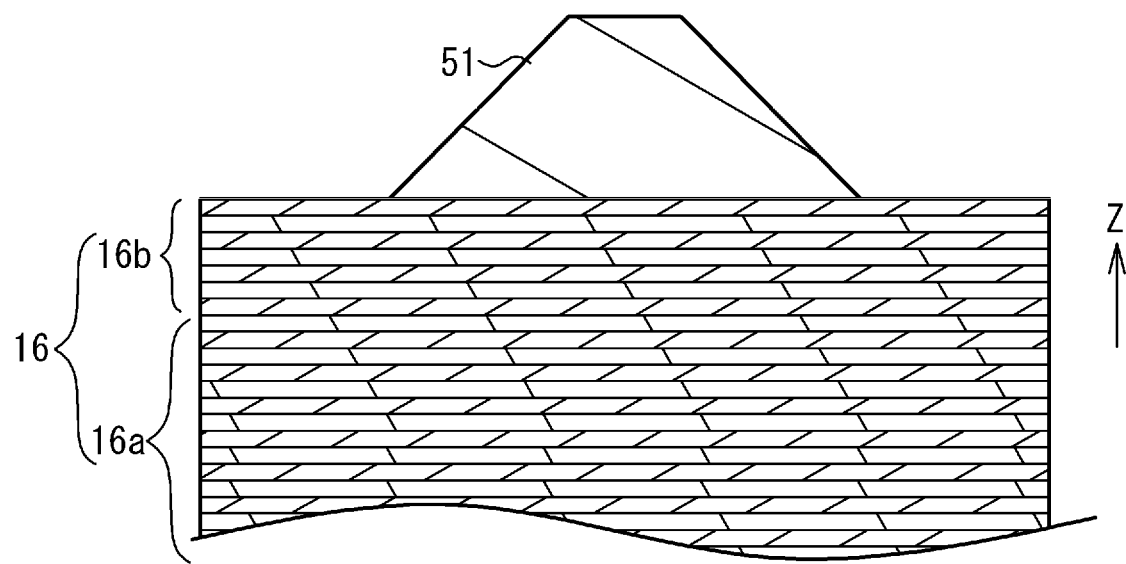
FIG. 5A is a cross-sectional view illustrating a method of manufacturing the surface-emitting laser.
Figure 5B:
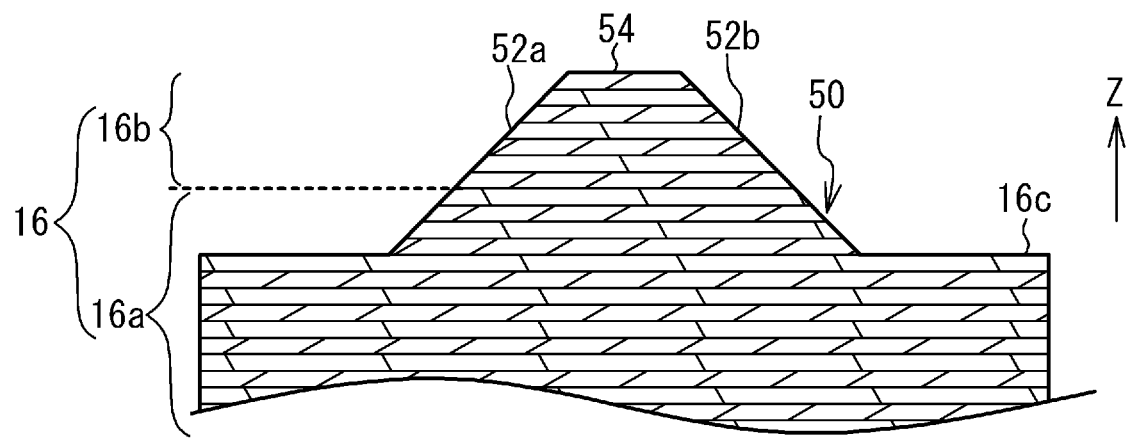
FIG. 5B is a cross-sectional view illustrating a method of manufacturing the surface-emitting laser.

Next, a method of manufacturing the surface-emitting laser 100 will be described. FIGS. 5A and 5B are cross-sectional views illustrating a method of manufacturing the surface-emitting laser 100. FIGS. 6A to 9B are plan views illustrating method of manufacturing the surface-emitting laser 100.

First, the lower DBR layer 12, the active layer 14 and the upper DBR layer 16 are epitaxially grown on the substrate 10 in this order by a metal organic chemical vapor deposition (MOCVD) method or molecular beam epitaxy (MBE) method, for example. During the growth of the lower DBR layer 12, the contact layer 15 is also grown. The upper DBR layer 16 includes a layer having a higher Al composition such as $Al_xGa_{1-x}As$ layers ($0.9 \leq x \leq 1.0$) for forming the oxide confinement layer 22.

Ion implantation is performed to form the high-resistance region 20. Specifically, for example, a photoresist having a thickness of 10 μm or more and 15 μm or less is applied by spin coating. A portion of the photoresist is covered with a mask, and irradiated with, for example, ultraviolet (UV) light having a wavelength of 365 nm using an exposure device. An exposed portion of the photoresist is dissolved in an alkaline solution such as tetramethylammonium hydroxide (TMAH) to leave a masked portion of the photoresist. For example, ions such as protons ($H^+$) are implanted to form the high-resistance region 20. The portion of the wafer covered with the photoresist is not implanted with protons, and the portion exposed from the photoresist is implanted with protons. An implantation depth is, for example, 5 μm. After the ion implantation, the photoresist is removed with an organic solvent and by ashing with an oxygen plasma or the like.

In FIG. 5A, the upper DBR layer 16 is illustrated. A photoresist having a thickness of 2.5 μm or more, for example, is applied onto the upper DBR layer 16 by spin coating. A resist mask 51 covering a portion of the upper DBR layer 16 is formed by exposure, development and post baking of the photoresist. The resist mask 51 has a truncated cone shape, for example. The inclination angle of the resist mask 51 can be adjusted by exposure conditions, temperature and time for post baking, and the like. Using the resist mask 51, the upper DBR layer 16 is dry-etched to a depth of 2.5 μm, for example. As illustrated in FIG. 5B, the shape corresponding to the shape of the resist mask 51 is also formed on the upper DBR layer 16. That is, the corner reflector 50 is formed by dry-etching.

Figure 6A:
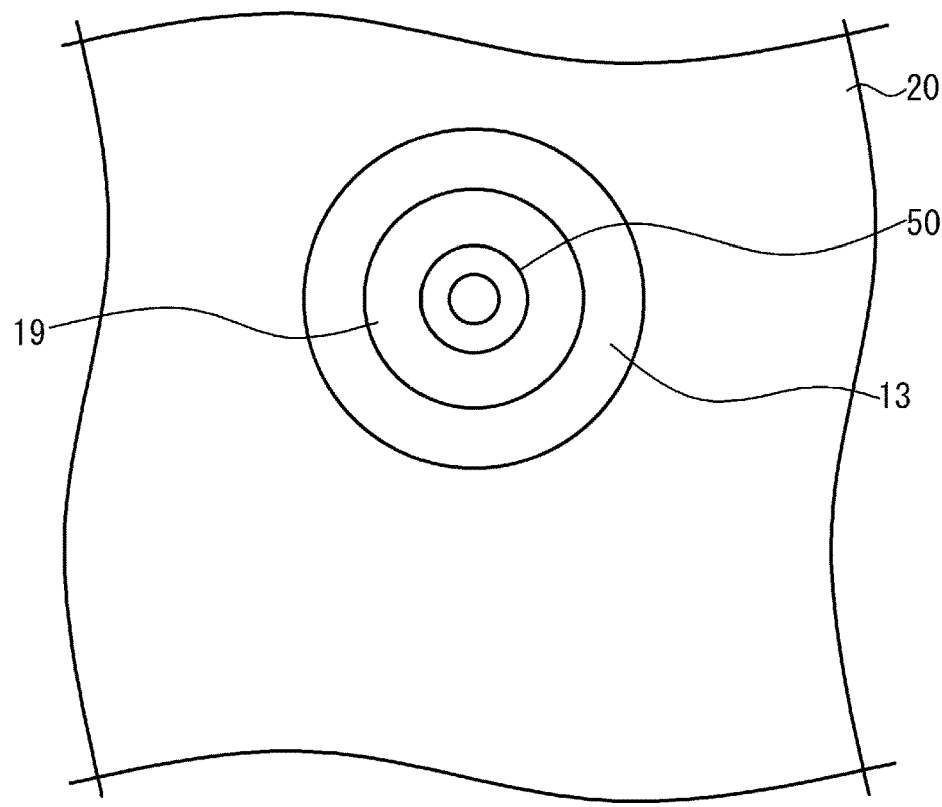
FIG. 6A is a plan view illustrating a method of manufacturing the surface-emitting laser.
Figure 6B:
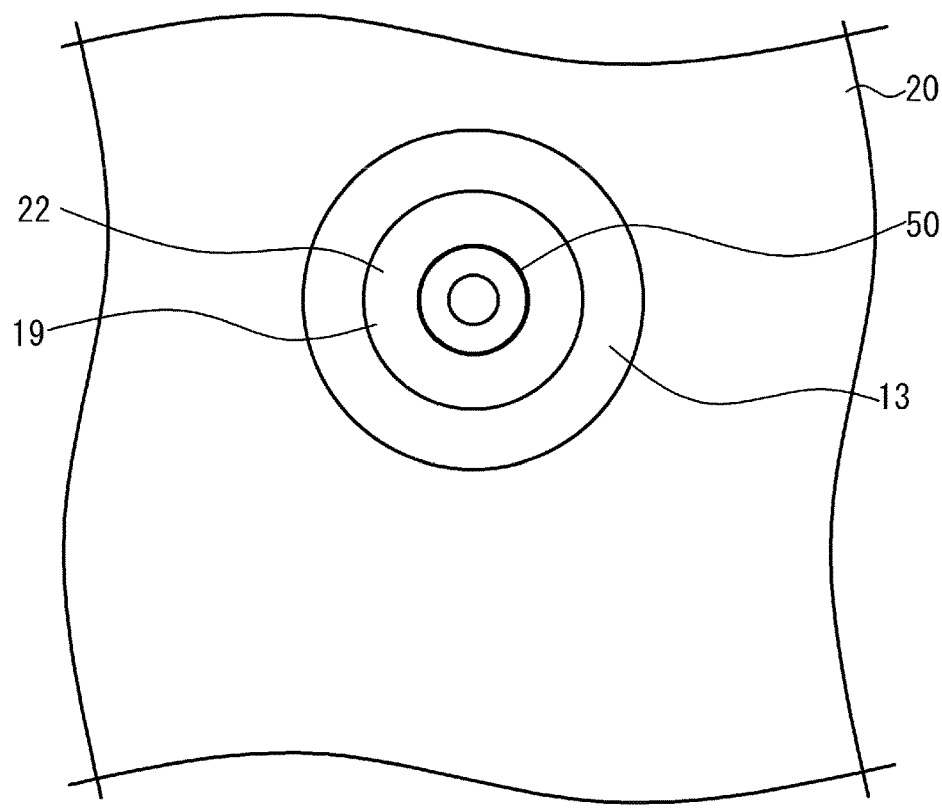
FIG. 6B is a plan view illustrating a method of manufacturing the surface-emitting laser.

As illustrated in FIG. 6A, the mesa 19 is formed by dry-etching the high-resistance region 20 using, for example, an inductively-coupled-plasma reactive ion etching (ICP-RIE) apparatus. At this time, the groove 13 reaching the lower DBR layer 12 is formed in the high-resistance region 20, and the portion which is not to be etched is protected by a photoresist (not illustrated). As the etching gas, for example, a $BCl_3$ gas or a mixed gas of $BCl_3$ and $Cl_2$ is used. Examples of etching conditions are described below:

$BCl_3$/Ar=30 sccm/70 sccm
(or $BCl_3/Cl_2$/Ar=20 sccm/10 sccm/70 sccm)
ICP-RIE power: 50 W to 1000 W
Bias power: 50 W to 500 W
Temperatures of wafer: 25° C. or less As illustrated in FIG. 6B, by being heated to about 400° C. in a water vapor atmosphere, a portion of the upper DBR layer in the mesa 19 is oxidized from the side surfaces of the mesa 19 to form the oxide confinement layer 22. A heating time is determined so that the oxide confinement layer 22 reach a predetermined width and an unoxidized portion having a predetermined width remains between the oxide confinement layer 22.

Figure 7A:
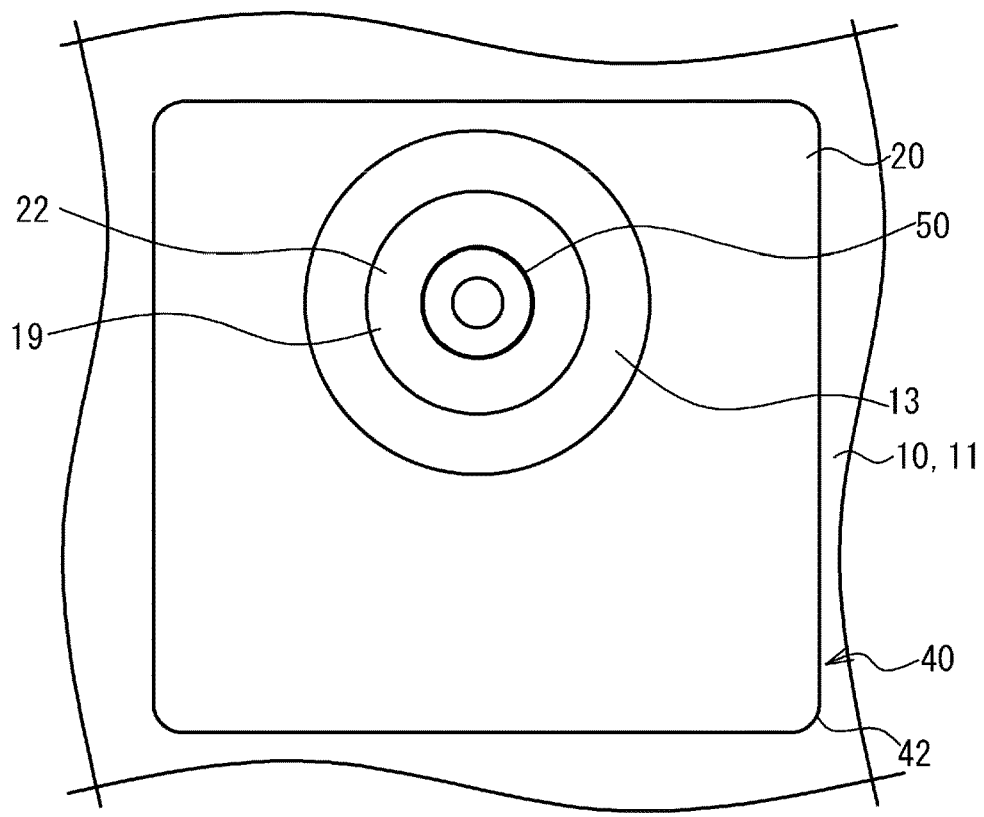
FIG. 7A is a plan view illustrating a method of manufacturing the surface-emitting laser.

As illustrated in FIG. 7A, a trench 11 is formed by dry-etching a portion of the high-resistance region 20, the lower DBR layer 12, and the substrate 10. The portions that are not to be etched, such as the mesa 19 and the groove 13, are covered with a photoresist (not illustrated). As the etching gas, for example, a $BCl_3$ gas or a mixed gas of $BCl_3$ and $Cl_2$ is used. Examples of etching conditions are described below:

$BCl_3$/Ar=30 sccm/70 sccm
(or $BCl_3/Cl_2$/Ar=20 sccm/10 sccm/70 sccm)
ICP-RIE power: 50 W to 1000 W
Bias power: 50 W to 500 W
Temperatures of wafer: 25° C. or less The trench 11 is provided for separating elements. A depth of the trench 11 is 7 μm, for example. The substrate 10 is exposed in the trench 11. The mesa 40 having the chamfered portion 42 is formed inside the trench 11. Since the lower DBR layer 12, the active layer 14, and the upper DBR layer 16 are separated between the plurality of surface-emitting lasers 100, the plurality of surface-emitting lasers 100 are electrically separated each other. A distance between the adjacent surface-emitting lasers 100 is 30 μm to 60 μm, for example.

Figure 7B:
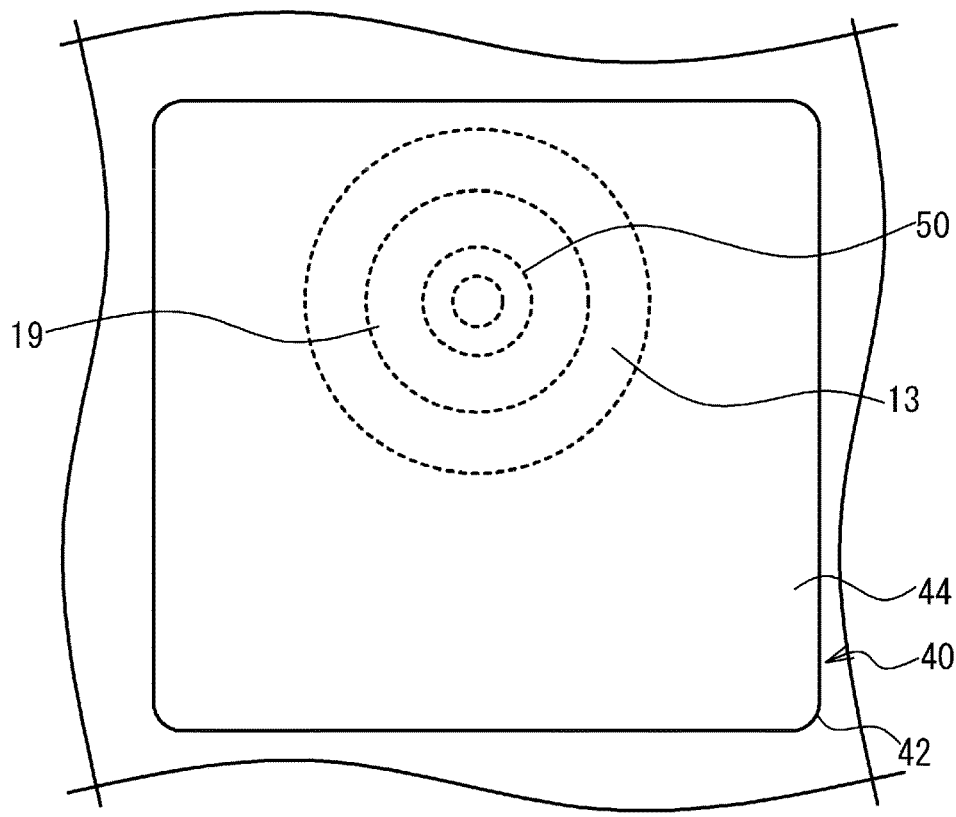
FIG. 7B is a plan view illustrating a method of manufacturing the surface-emitting laser.

As illustrated in FIG. 7B, the insulating film 44 covering the wafer is formed by, for example, a plasma-CVD method. The insulating film 44 is, for example, a SiON film or a $SiO_2$ film.

Figure 8A:
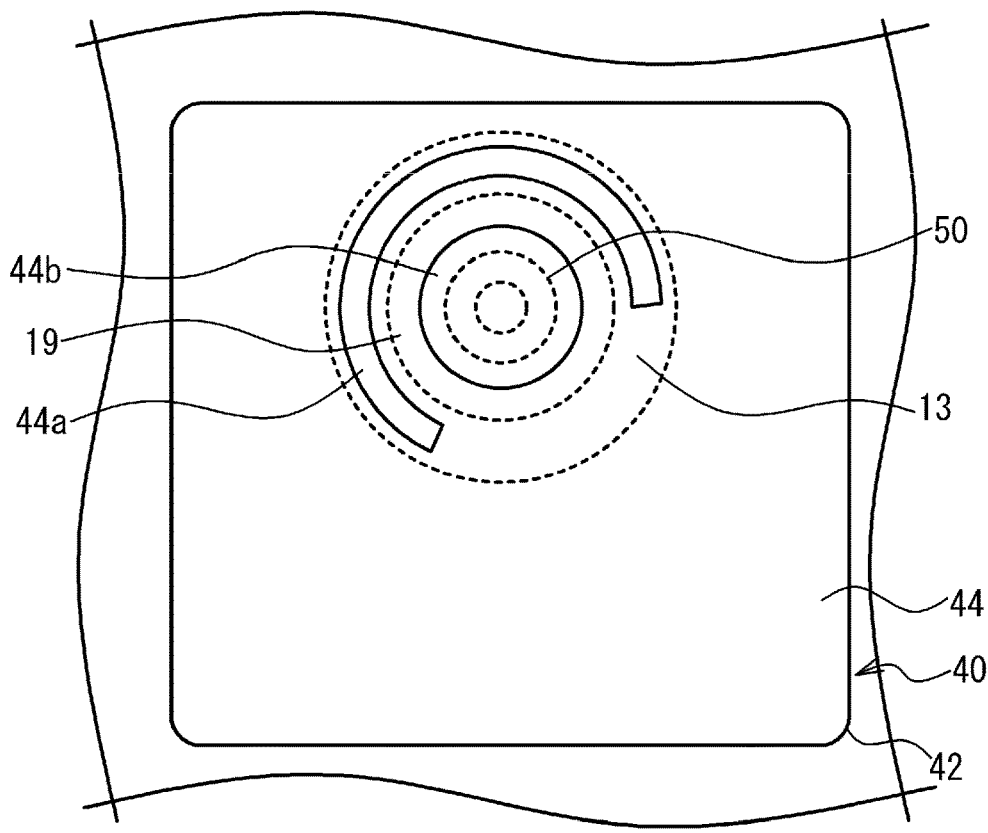
FIG. 8A is a plan view illustrating a method of manufacturing the surface-emitting laser.

As illustrated in FIG. 8A, openings 44*a* and 44*b* are formed in the insulating film 44 by forming, etching and the like of a resist pattern. The opening 44*a* is located in the groove 13, and the opening 44*b* is located on the mesa 19.

Figure 8B:
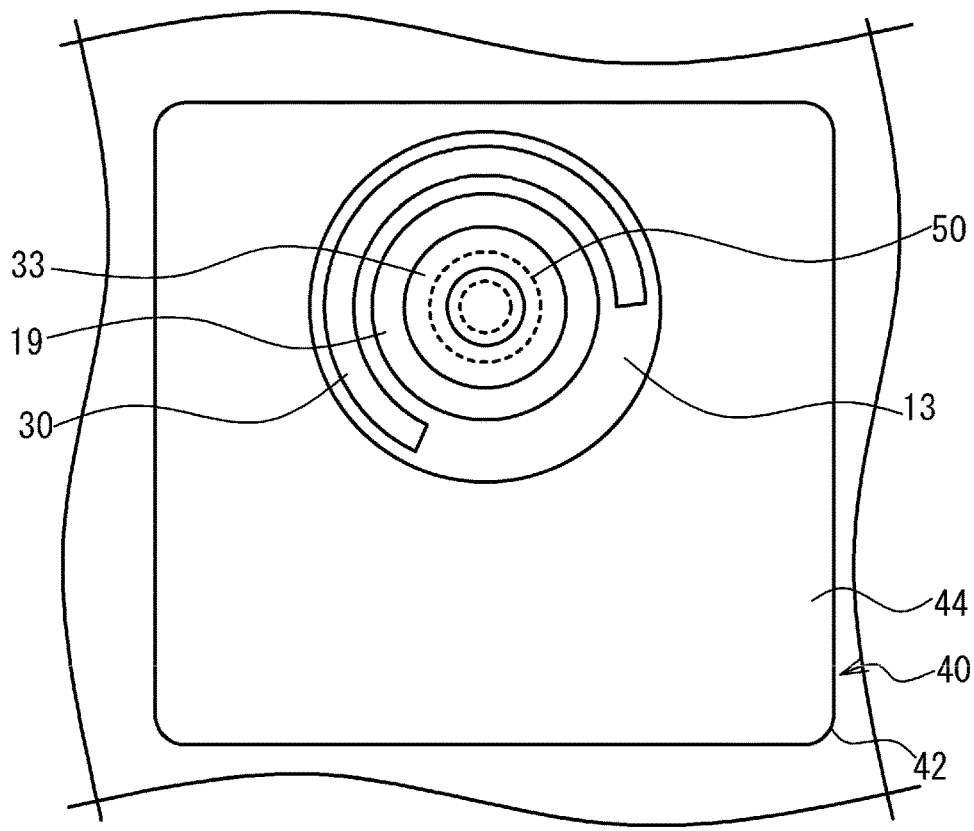
FIG. 8B is a plan view illustrating a method of manufacturing the surface-emitting laser.

As illustrated in FIG. 8B, by resist-patterning and vacuum-evaporation, the electrode 30 is formed on the surface of contact layer 15 in the opening 44*a*, and the electrode 33 is formed on the surface of the upper DBR layer 16 in the opening 44*b*. After the electrodes are formed, heat treatment is performed, for example, at a temperature of about 400° C. for one minute, so that ohmic contact is formed between the electrodes and the semiconductors. The electrode 30 is electrically connected to the lower DBR layer 12, and the electrode 33 is electrically connected to the upper DBR layer 16.

Figure 9A:
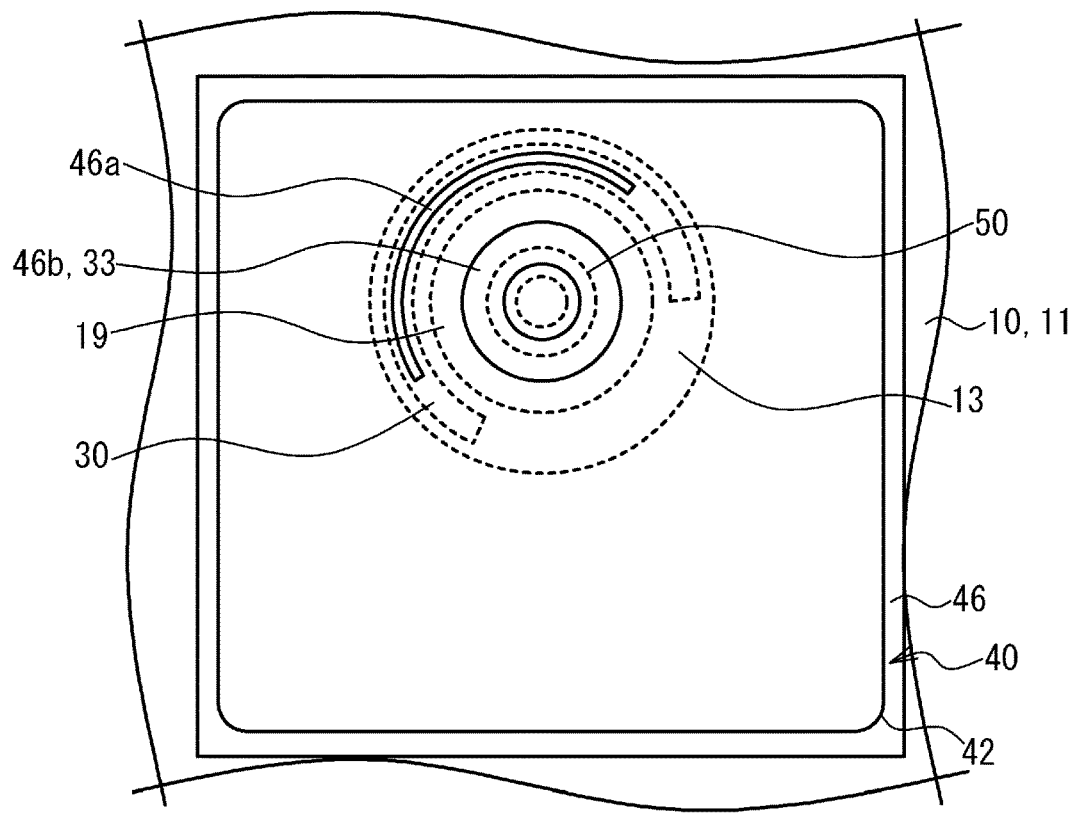
FIG. 9A is a plan view illustrating a method of manufacturing the surface-emitting laser.

As illustrated in FIG. 9A, the insulating film 46 is formed on the insulating film 44, the electrodes 30 and 33 by the plasma-CVD method, for example. The insulating film 46 is formed of an insulator such as SiN, for example. As illustrated in FIG. 9A, the insulating film 46 is etched using a resist pattern to form, in the insulating film 46, an opening 46*a* where the electrode 30 is exposed and an opening 46*b* where the electrode 33 is exposed. Portions of the insulating films 44 and 46 within the trench 11 are also etched to expose the substrate 10.

Figure 9B:
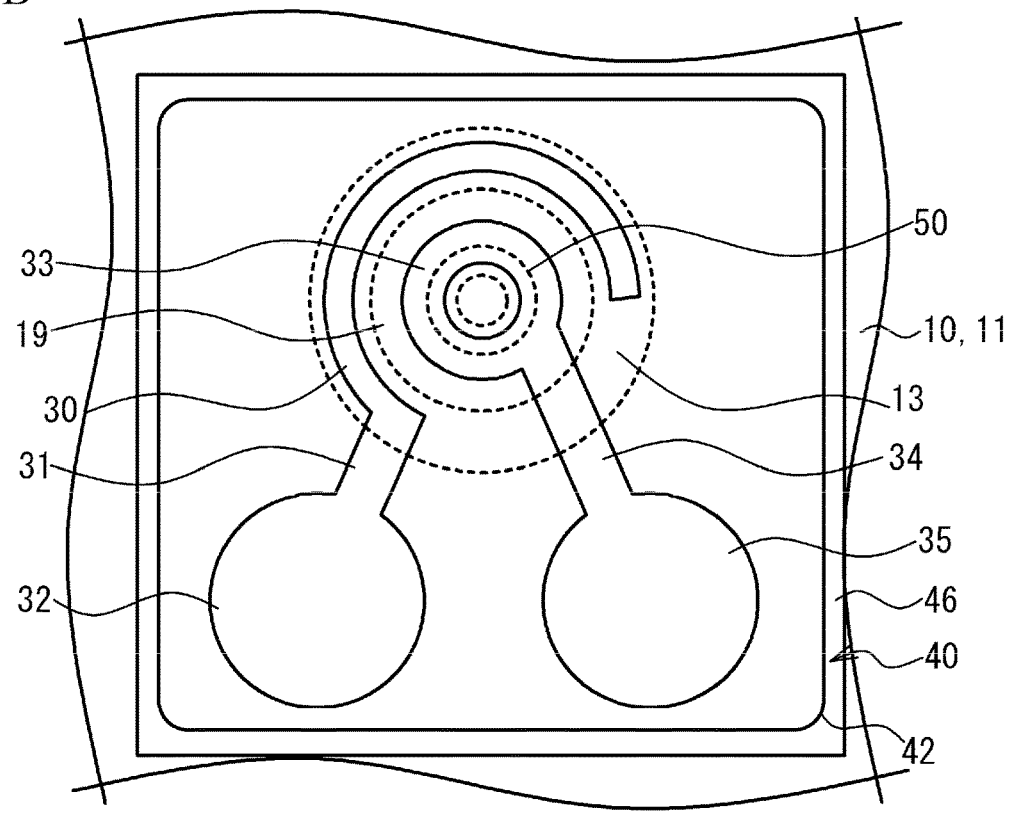
FIG. 9B is a plan view illustrating a method of manufacturing the surface-emitting laser.

As illustrated in FIG. 9B, the wiring 31 and the pad 32 each connected to the electrode 30, and the wiring 34 and the pad 35 each connected to the electrode 33 are formed by plating or the like. Further, an insulating film (passivation film, not illustrated) is provided, and an opening where the pad 32 is exposed and an opening where the pad 35 is exposed are provided in the passivation film.

A back surface of the substrate 10 is polished by using a tool such as a back grinder or a lapping apparatus to a thickness of about 100 μm to 200 μm. The wafer is attached to a tape, and then the substrate 10 is cut along the trench 11 using a blade or the like to make the surface-emitting laser 100 chips.

According to the first embodiment, the corner reflector 50 is provided in the upper DBR layer 16, and the plan shape of the corner reflector 50 is circular. The corner reflector 50 has a rotational symmetry about the optical axis AX and forms a resonator together with the lower DBR layer 12. By the resonator, the rotationally asymmetrical high-order transverse modes are suppressed and the rotationally symmetrical high-order transverse modes can oscillate. As a result, the number of peaks in the oscillation spectrum can be reduced as illustrated in FIG. 4B.

The lower DBR layer 12 and the upper DBR layer 16 form the first resonator, while the lower DBR layer 12 and the corner reflector 50 form the second resonator. The first resonator provides the modulation bandwidth comparable to that of a surface-emitting laser without the corner reflector 50. The second resonator can suppress the rotationally asymmetrical high-order transverse modes and reduce the number of peaks in the oscillation spectrum. By reducing the number of peaks in the oscillation spectrum, the modulation bandwidth is expanded to enable a high-speed modulation. For example, as illustrated in FIG. 4B, the modulation bandwidth is approximately 1.4 times larger by halving the number of peaks in the oscillation spectrum compared to FIG. 4A.

The corner reflector 50 is truncated cone in shape, and totally reflects the light on the inclined surface of the corner reflector 50 to return the light to the lower DBR layer 12. The corner reflector 50 has the rotational symmetry about the optical axis AX. Therefore, the rotationally symmetrical high-order transverse modes become dominant, and the rotationally asymmetrical high-order transverse modes are strongly suppressed. The number of peaks in the oscillation spectrum is reduced and a high-speed modulation characteristic is realized.

As illustrated in FIG. 2, the side surface of the corner reflector 50 is inclined by, for example, 45° with respect to the top surface of the upper DBR layer 16. The light incident on the corner reflector 50 can be reflected on the side surface to return toward the active layer 14. The amplitude distribution of the reflected light is inverted from that of the incident light. The inclination angle θ of the side surface of the corner reflector 50 need not be 45° at all positions of the side surface. The side surface may include a surface inclined by 45°, and a portion of the side surface may be inclined by 45° or more or may be inclined by less than 45°, for example. A mean inclination angle θ from the surface 16c to the surface 54 is 45°. The corner reflector 50 may have a function of reflecting the incident light with inverting the amplitude distribution of the incident light.

The top surface (surface 54) of the corner reflector 50 functions as the emitting window of light and can emit the light from the surface 54 to the outside. It is preferable that the width W2 (diameter) of the surface 54 is twice or more of a width that can emit only the basic traverse-mode components. Specifically, when the oscillation wavelength is 850 nm to 900 nm, the width W2 is 5 μm or more. By increasing the width W2 in this manner, not only the light of the basic traverse-mode component but also the light of the high-order transverse mode component can be emitted from the surface 54, and the light output can be improved.

By forming the corner reflector 50 by etching the upper DBR layer 16, the number of semiconductor layers contained in the upper DBR layer 16 between the electrode 30 and the electrode 33 is reduced as compared with the case where no corner reflector 50 is provided. The volume of the upper DBR layer 16 is reduced, for example, by half. The parasitic capacitance decreases and the modulation bandwidth further expands.

The entire upper DBR layer 16 may be a p-DBR layer, but the upper DBR layer 16 preferably includes the p-DBR layer 16a and the i-DBR layer 16b which are stacked in this order. The electrode 33 is connected to the p-DBR layer 16a and not to the i-DBR layer 16b. A current can be injected from the electrode 33 through the p-DBR layer 16a into the active layer 14. Since the upper DBR layer 16 includes the i-DBR layer 16b, the parasitic capacitance is lowered to further expand the modulation bandwidth. The lower DBR layer 12 may be a p-type layer, and an n-type layer may be provided instead of the p-DBR layer 16a of the upper DBR layer 16. That is, the upper DBR layer 16, the active layer 14 and the lower DBR layer 12 have a p-i-n structure or an n-i-p structure in the downward direction in FIG. 2.

As illustrated in FIG. 3A, the shape of the corner reflector 50 is the truncated cone, and as illustrated in FIG. 3B, the plan shape is circular. As described below in the modification, the shape of the corner reflector is not limited to the truncated cone, and the shape may have many rotational symmetries about the optical axis AX.

(Modification)

Figure 10:
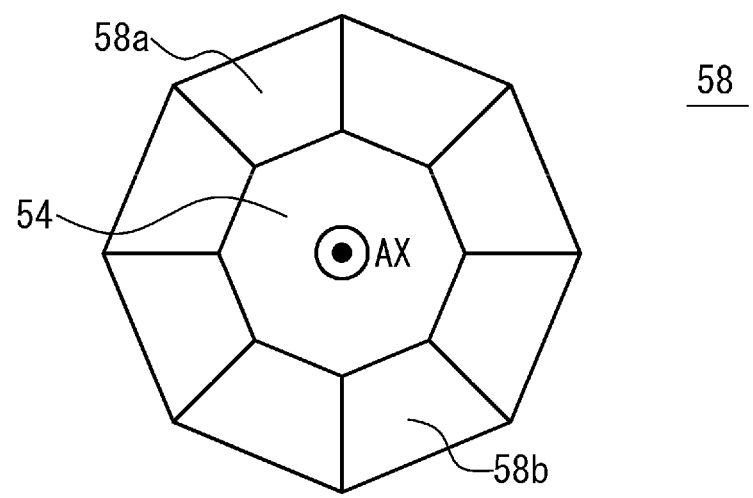
FIG. 10 is a plan view illustrating a corner reflector of a surface-emitting laser according to a modification.

FIG. 10 is a plan view illustrating a corner reflector 58 of a surface-emitting laser according to the modification. The modification has the same configuration as that of the first embodiment except for the corner reflector. The corner reflector 58 has a plan shape of a truncated octagonal pyramid. As illustrated in FIG. 10, the plan shape of the corner reflector 58 is a regular octagon. The corner reflector 58 has a 360/8-degree rotational symmetry about an optical axis AX. The 360/8-degree rotational symmetry means a rotational symmetry in which the shape of the corner reflector 58 overlaps the original shape when the corner reflector 58 is rotated by an angle of ⅛ of 360°. A surface 58a and a surface 58b face each other across the optical axis AX. Similarly to these surfaces, one of the eight side surfaces of the corner reflector 58 opposes one side surface across the optical axis AX. The surface 54 functions as the emitting window.

The corner reflector 58 and the lower DBR layer 12 illustrated in FIG. 1B form a resonator. A light incident on the surface 58a of the corner reflector 58 from the active layer 14 is totally reflected on the surface 58a, and then the light is incident and totally reflected on the surface 58b to return to the incident direction. The light returning to the incident direction is reflected on the lower DBR layer 12 and again incident on the surface 58b. The light incident on the surface 58b is totally reflected on the surface 58b, and the light is incident and totally reflected on the surface 58a to return to the incident direction. The corner reflector 58 reflects the light with inverting the amplitude distribution of the incident light.

According to the modification, the corner reflector 58 has 8 rotational symmetries about the optical axis AX. The resonator formed by the corner reflector 58 and the lower DBR layer 12 suppresses the first-order to third-order rotationally asymmetrical high-order transverse modes, and the rotationally symmetrical high-order transverse modes can mainly oscillate. As in FIG. 4B, the number of peaks in the oscillation spectrum is reduced. By reducing the number of peaks in the oscillation spectrum, the modulation bandwidth is expanded to enable a high-speed modulation.

When the plan shape of the corner reflector is a polygon having an odd number of vertexes, there is no intrinsic solution that the amplitude distribution returns to the original state even if a light reciprocates once within the second resonator, and a good oscillation cannot be obtained. Since the plan shape of the corner reflector is a polygon having an even number of vertexes, the rotationally asymmetrical high-order transverse modes can be suppressed and the rotationally symmetrical high-order transverse modes can mainly oscillate. It is more preferable that the plan shape of the corner reflector is a polygon having vertexes of an even number and 8 or more, and two sides opposed to each other across the optical axis AX are parallel to each other. The corner reflector may be, for example, a truncated decagonal pyramid, a truncated dodecagonal pyramid, a truncated icosagonal pyramid, or the like.

As illustrated in the first embodiment and the modification, the corner reflector is a truncated cone, or a truncated polygonal pyramid whose base has vertexes of an even number and 8 or more. The plan shape of the corner reflector is a circular shape, or a polygonal shape having vertexes of an even number and 8 or more. Since the corner reflector has 8 or more rotational symmetries about the optical axis AX, the rotationally asymmetrical high-order transverse modes can be suppressed. When the plan shape of the corner reflector is a polygon, the width of the emitting window is defined by the diameter of the inscribed circle of the polygon. When the plan shape of the corner reflector is circular, the width of the emitting window is defined by the diameter of the circle.

Second Embodiment

Figure 11:
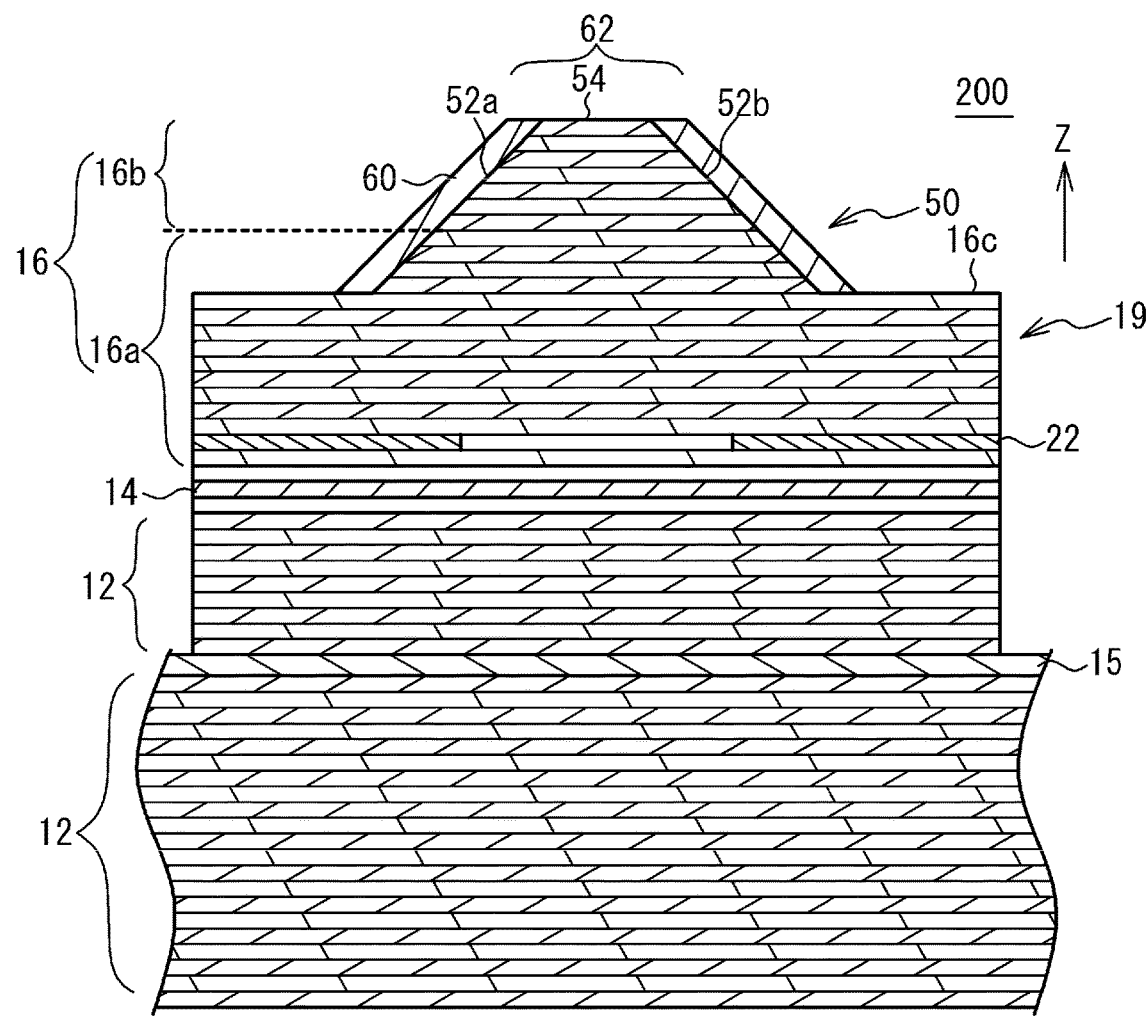
FIG. 11 is a cross-sectional view illustrating a surface-emitting laser according to a second embodiment.

FIG. 11 is a cross-sectional view illustrating a surface-emitting laser 200 according to the second embodiment, and the mesa 19 is enlarged. The description of the same configuration as that of the first embodiment is omitted.

As illustrated in FIG. 11, a cap layer 60 is provided on the side surface of the corner reflector 50. The cap layer 60 covers the entire side surface of the corner reflector 50a having a truncated-cone shape, but does not cover the surface 54. The upper end of the cap layer 60 (end near the surface 54) is flush with the surface 54 of the corner reflector 50 and forms a surface 62 together with the surface 54. The side surface of the cap layer 60 has the same angle as the corner reflector 50 and are inclined by 45° with respect to the surface 16c.

The cap layer 60 is made of, for example, Si, SiN, titanium oxide ($TiO_2$), or the like, and functions as a light guide layer. A refractive index of the cap layer 60 is lower than that of the upper DBR layer 16 and higher than that of air. A refractive index of AlGaAs of the upper DBR layer 16 is, for example, about 3.9, and a refractive index of air is about 1. The refractive index of the cap layer 60 is 2.73 or more and less than 3.9, for example. The refractive indexes here are refractive indexes at an oscillation wavelength.

Since the refractive index of the cap layer 60 is 2.73 or more, a light incident on the corner reflector 50 is not totally reflected, a part of the light is reflected by the corner reflector 50, and another part of the light is incident on the cap layer 60. For example, a part of light incident from a downward direction on the surface 52a of the corner reflector 50 is transmitted through the surface 52a and incident on the cap layer 60. The light propagates in an upward direction in the cap layer 60, and is reflected at the interface between the cap layer 60 and air. The light propagates horizontally, and is further reflected at the interface between the cap layer 60 and the surface 52a. Finally, the light is emitted in the upward direction from the surface 62. A light incident horizontally on the cap layer 60 is reflected at the interface between the cap layer 60 and air, and at the interface between the cap layer 60 and the upper DBR layer 16, propagates downward, and is reflected on the upper DBR layer 16. Finally, the light is emitted in the upward direction from the surface 62. The cap layer 60 functions as the light guide layer for propagating an incident light to the surface 62, and the surface 62 functions as the emitting window.

According to the second embodiment, the light incident on the cap layer 60 is propagated in the cap layer 60 and emitted from the surface 62. Therefore, light loss is suppressed to achieve a high output. Similarly to the first embodiment, the number of peaks in the oscillation spectrum can be reduced and the modulation bandwidth can be enlarged. By providing an oxide film on the surface of the corner reflector 50 and lowering the refractive index, the amount of light incident on the cap layer 60 can be adjusted.

Third Embodiment

Figure 12A:
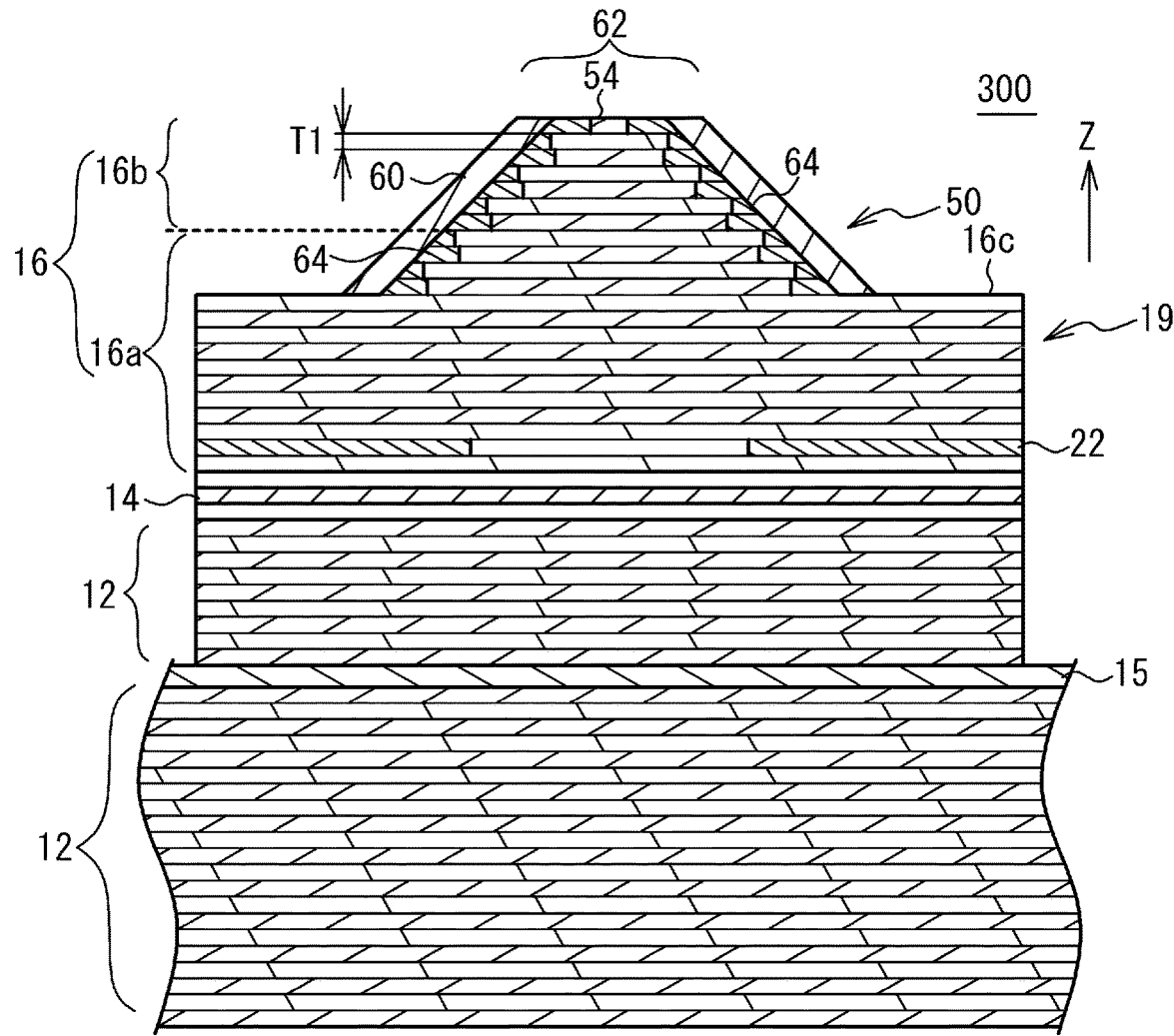
FIG. 12A is a cross-sectional view illustrating a surface-emitting laser according to a third embodiment.

FIG. 12A is a cross-sectional view illustrating a surface-emitting laser 300 according to the third embodiment, and the mesa 19 is enlarged. The description of the same configuration as that of the first embodiment is omitted. As illustrated in FIG. 12A, an oxidized region 64 is formed in a portion to be the corner reflector 50 in the upper DBR layer 16. More specifically, the oxidized region 64 is formed in each of semiconductor layers (AlGaAs layers) included in the upper DBR layer 16. The thickness T1 of the single oxidized region 64 (the thickness of a single semiconductor layer in the upper DBR layer 16) is from 50 nm to 100 nm, for example. Each of the plurality of oxidized regions 64 extends inwardly from a side surface of the upper DBR layer 16. The horizontal length of each oxidized region 64 differs depending on the Al-composition ratio of the semiconductor layer (AlGaAs layer) of the upper DBR layer 16. The Al composition ratio in the oxidized region 64 is lower than the Al composition ratio in the oxide confinement layer 22.

Figure 12B:
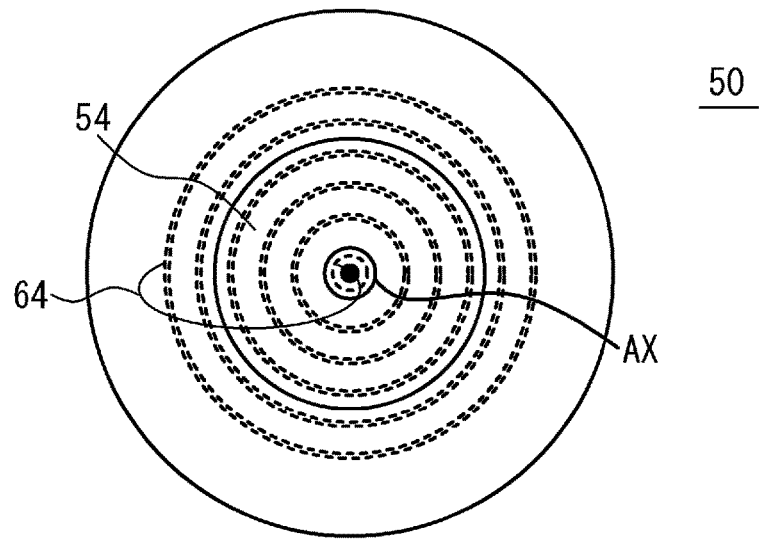
FIG. 12B is a plan view illustrating a corner reflector of a surface-emitting laser according to the third embodiment.

FIG. 12B is a plan view illustrating the corner reflector 50. The inner ends of the plurality of oxidized regions 64 are indicated by dotted lines. As illustrated in FIG. 12B, the plurality of oxidized regions 64 are concentrically arranged about the optical axis AX. The refractive indexes of the oxidized regions 64 are lower than the refractive indexes of the portions of the upper DBR layer 16 other than the oxidized regions 64.

The oxidized regions 64 are provided in the corner reflector 50 to generate a refractive index distribution in the corner reflector 50. A thickness T1 of each one oxidized region 64 is smaller than the oscillation wavelength, and a period of the refractive index distribution is smaller than that of the oscillation wavelength. The plurality of oxidized regions 64 function as a diffraction grating. A light incident on the corner reflector 50 is scattered by the oxidized regions 64, and is incident on the cap layer 60. The light is guided by the cap layer 60, and emitted from the surface 62. According to the third embodiment, light loss is suppressed to achieve a high output. Further, similarly to the first embodiment, the number of peaks in the oscillation spectrum can be reduced and the modulation bandwidth can be enlarged.

The refractive index of the cap layer 60 in the third embodiment may be equal to or greater than the refractive index of the upper DBR layer 16. The cap layer 60 need not be provided.

Fourth Embodiment

Figure 13:
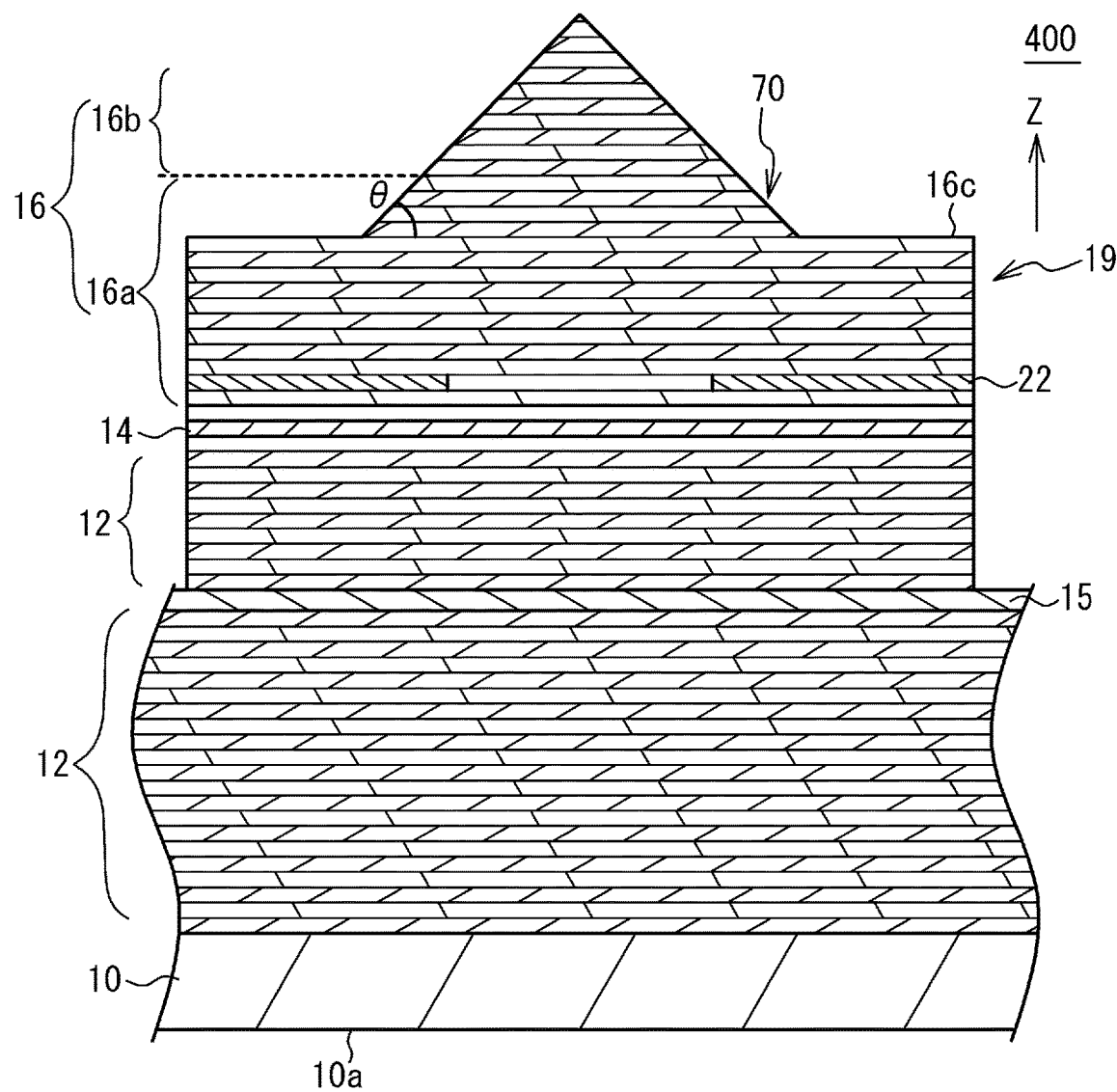
FIG. 13 is a cross-sectional view illustrating a surface-emitting laser according to a fourth embodiment.

FIG. 13 is a cross-sectional view illustrating a surface-emitting laser 400 according to the fourth embodiment, and the mesa 19 is enlarged. The description of the same configuration as that of the first embodiment is omitted.

As illustrated in FIG. 13, the upper DBR layer 16 is provided with a corner reflector 70 instead of the corner reflector 50. The corner reflector 70 is cone in shape and tapers in an upward direction. The corner reflector 70 does not have a surface to be the light emitting window, but has an apex at its upper end. A light incident on the corner reflector 70 is reflected in a downward direction by the corner reflector 70 and emitted from a lower surface 10a of the substrate 10. A width of the surface 10a (diameter) is preferably twice or more of the width capable of emitting the light of only basic traverse-mode components.

According to the fourth embodiment, the corner reflector 70 has the cone shape and many rotational symmetries. Similarly to the first embodiment, the number of peaks in the oscillation spectrum can be reduced and the modulation bandwidth can be enlarged. Since the surface 10a of the substrate 10 functions as the emitting window, light can be emitted from the lower side.

In addition to the cone, the shape of the corner reflector 70 may be a polygonal pyramid whose base has vertexes of an even number and 8 or more such as an octagonal pyramid, decagonal pyramid, dodecagonal pyramid and the like. In order to reflect a light and return the light toward the surface 10a, the corner reflector 70 preferably has a vertex.

The embodiments of the present disclosure have been described above. However, the embodiments of the present disclosure disclosed above are only illustrative, and the scope of the present invention is not limited to the specific embodiments of the disclosure. It is to be understood that the scope of the present invention is defined in the appended claims and includes equivalence of the description of the claims and all changes within the scope of the claims.

What is claimed is:

1. A surface-emitting laser comprising:
a first reflector layer;
an active layer on the first reflector layer; and
a second reflector layer on the active layer,
the second reflector layer including a corner reflector that tapers in a direction opposite to the first reflector layer,
the corner reflector having a plan shape of a circle or a polygon with an even number of vertexes, and
a cap layer on a side surface of the corner reflector, wherein
the corner reflector has a shape of a truncated cone or a truncated polygonal pyramid, and a top surface of the corner reflector is an emitting window configured to emit a light, and
the cap layer has a refractive index of 2.73 or more and lower than the second reflector layer, and the light is emitted from the top surface of the corner reflector and a top surface of the cap layer.

2. The surface-emitting laser according to claim 1, wherein when the corner reflector is rotated by a predetermined angle of 360/8 degrees or less around an optical axis of the surface-emitting laser, the corner reflector has a rotational symmetry that overlaps the corner reflector before the rotation.

3. The surface-emitting laser according to claim 1, wherein the second reflector layer includes an oxidized region extending inwardly from a side surface of the corner reflector.

4. The surface-emitting laser according to claim 1, further comprising a substrate,
wherein the first reflector layer, the active layer, and the second reflector are in this order on the substrate,
the corner reflector has a shape of a cone or a polygonal pyramid, and
a lower surface of the substrate is an emitting window configured to emit a light.

5. The surface-emitting laser according to claim 1, wherein a width of the emitting window is twice or more of a width capable of emitting the light of only basic traverse-mode components.

6. The surface-emitting laser according to claim 1, wherein the corner reflector is configured to reflect a light with inverting an amplitude distribution of an incident light.

7. The surface-emitting laser according to claim 1, wherein a side surface of the corner reflector includes a surface that is inclined by 45° with respect to a top surface of the first reflector layer.

8. The surface-emitting laser according to claim 1, wherein each of the first reflector layer and the second reflector layer is a distributed Bragg reflector layer including a plurality of stacked semiconductor layers.

9. A surface-emitting laser comprising:
a first reflector layer;
an active layer on the first reflector layer; and
a second reflector layer on the active layer,
the second reflector layer including a corner reflector that tapers in a direction opposite to the first reflector layer, and
the corner reflector having a plan shape of a circle or a polygon with an even number of vertexes,
wherein the first reflector layer is a p-type or n-type semiconductor layer, the second reflector layer includes a third reflector layer and a fourth reflector layer that are stacked in order above the active layer, the third reflector layer is a semiconductor layer of a conductivity type opposed to a conductivity type of the first reflector layer, and the fourth reflector layer is an undoped semiconductor layer.

10. The surface-emitting laser according to claim 9, wherein when the corner reflector is rotated by a predetermined angle of 360/8 degrees or less around an optical axis of the surface-emitting laser, the corner reflector has a rotational symmetry that overlaps the corner reflector before the rotation.

11. The surface-emitting laser according to claim 9, wherein the corner reflector has a shape of a truncated cone or a truncated polygonal pyramid, and a top surface of the corner reflector is an emitting window configured to emit a light.

12. The surface-emitting laser according to claim 11, further comprising a cap layer on a side surface of the corner reflector, wherein the cap layer has a refractive index of 2.73 or more and lower than the second reflector layer, and the light is emitted from the top surface of the corner reflector and a top surface of the cap layer.

13. The surface-emitting laser according to claim 11, wherein the second reflector layer includes an oxidized region extending inwardly from a side surface of the corner reflector.

14. The surface-emitting laser according to claim 9, further comprising a substrate,
   wherein the first reflector layer, the active layer, and the second reflector are in this order on the substrate,
   the corner reflector has a shape of a cone or a polygonal pyramid, and
   a lower surface of the substrate is an emitting window configured to emit a light.

15. The surface-emitting laser according to claim 11, wherein a width of the emitting window is twice or more of a width capable of emitting the light of only basic traverse-mode components.

16. The surface-emitting laser according to claim 9, wherein the corner reflector is configured to reflect a light with inverting an amplitude distribution of an incident light.

17. The surface-emitting laser according to claim 9, wherein a side surface of the corner reflector includes a surface that is inclined by 45° with respect to a top surface of the first reflector layer.

18. The surface-emitting laser according to claim 9, wherein each of the first reflector layer and the second reflector layer is a distributed Bragg reflector layer including a plurality of stacked semiconductor layers.

* * * * *